US011115611B2

(12) United States Patent
Higashi et al.

(10) Patent No.: US 11,115,611 B2
(45) Date of Patent: Sep. 7, 2021

(54) SOLID-STATE IMAGING DEVICE AND IMAGING SYSTEM

(71) Applicant: PANASONIC SEMICONDUCTOR SOLUTIONS CO., LTD., Kyoto (JP)

(72) Inventors: Yosuke Higashi, Osaka (JP); Norihiko Sumitani, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

(21) Appl. No.: 15/930,152

(22) Filed: May 12, 2020

(65) Prior Publication Data

US 2020/0275045 A1    Aug. 27, 2020

Related U.S. Application Data

(63) Continuation of application No. PCT/JP2018/041127, filed on Nov. 6, 2018.

(30) Foreign Application Priority Data

Nov. 29, 2017   (JP) .............................. JP2017-229407

(51) Int. Cl.
H04N 5/374        (2011.01)
H04N 5/3745       (2011.01)
H03M 1/56         (2006.01)
H04N 5/378        (2011.01)

(52) U.S. Cl.
CPC .......... *H04N 5/37455* (2013.01); *H03M 1/56* (2013.01); *H04N 5/378* (2013.01)

(58) Field of Classification Search
CPC ................................................ H04N 5/37455

USPC ........................................................ 348/294
See application file for complete search history.

(56) References Cited

U.S. PATENT DOCUMENTS

2010/0271519 A1    10/2010 Ui et al.
2018/0109747 A1*    4/2018 Chae ..................... H03M 3/494

FOREIGN PATENT DOCUMENTS

JP          2010-258806 A      11/2010

OTHER PUBLICATIONS

International Search Report and Written Opinion dated Jan. 22, 2019 in International Application No. PCT/JP2018/041127; with partial English translation.

* cited by examiner

*Primary Examiner* — Joel W Fosselman
(74) *Attorney, Agent, or Firm* — McDermott Will and Emery LLP

(57) ABSTRACT

A solid-state imaging device includes a first converter which converts an analog signal representing a pixel value to an upper bit of a digital signal, and a second converter which converts the analog signal to a lower bit of the digital signal. The second converter includes a first latch circuit which latches, as phase information, a plurality of clock signals having different phases upon conversion to the upper bit in the first converter, a conversion circuit which generates the lower bit of the digital signal by converting the phase information to a binary value, and an adder, and a second latch circuit which latches an addition result of the adder. The adder adds the binary value converted by the conversion circuit and a value latched by the second latch circuit.

11 Claims, 20 Drawing Sheets

| BINARY VALUE (IN DECIMAL) | BINARY VALUE (BINARY EQUIVALENT) BIN[1:0] | PHASE SHIFT CODE PSCK[1:0] |
|---|---|---|
| 0 | 00 | 00 |
| 1 | 01 | 01 |
| 2 | 10 | 11 |
| 3 | 11 | 10 |

| BINARY VALUE (IN DECIMAL) | BINARY VALUE (BINARY EQUIVALENT) BIN[3:0] | PHASE SHIFT CODE PSCK[3:0] |
|---|---|---|
| 0 | 000 | 0000 |
| 1 | 001 | 0001 |
| 2 | 010 | 0011 |
| 3 | 011 | 0111 |
| 4 | 100 | 1111 |
| 5 | 101 | 1110 |
| 6 | 110 | 1100 |
| 7 | 111 | 1000 |

FIG. 4

| INPUT (PHASE INFORMATION) | | | | OUTPUT (BINARY DATA) | | |
|---|---|---|---|---|---|---|
| PSCK[0] | PSCK[1] | PSCK[2] | PSCK[3] | BIN[0] | BIN[1] | BIN[2] |
| 0 | 0 | 0 | 0 | 0 | 0 | 0 |
| 1 | 0 | 0 | 0 | 1 | 0 | 0 |
| 1 | 1 | 0 | 0 | 0 | 1 | 0 |
| 1 | 1 | 1 | 0 | 1 | 1 | 0 |
| 1 | 1 | 1 | 1 | 0 | 0 | 1 |
| 0 | 1 | 1 | 1 | 1 | 0 | 1 |
| 0 | 0 | 1 | 1 | 0 | 1 | 1 |
| 0 | 0 | 0 | 1 | 1 | 1 | 1 |

FIG. 5

| INPUT | | | OUTPUT | |
|---|---|---|---|---|
| INPUT A | INPUT B | CARRY INPUT X | RESULT OF ADDITION S | CARRY OUTPUT C |
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

| INPUT | | | OUTPUT |
|---|---|---|---|
| INPUT A | INPUT B | CONTROL INPUT SEL | OUTPUT Y |
| 0 | 0 | 0 | 0 |
| 0 | 1 | 0 | 0 |
| 1 | 0 | 0 | 1 |
| 1 | 1 | 0 | 1 |
| 0 | 0 | 1 | 0 |
| 0 | 1 | 1 | 1 |
| 1 | 0 | 1 | 1 |
| 1 | 1 | 1 | 0 |

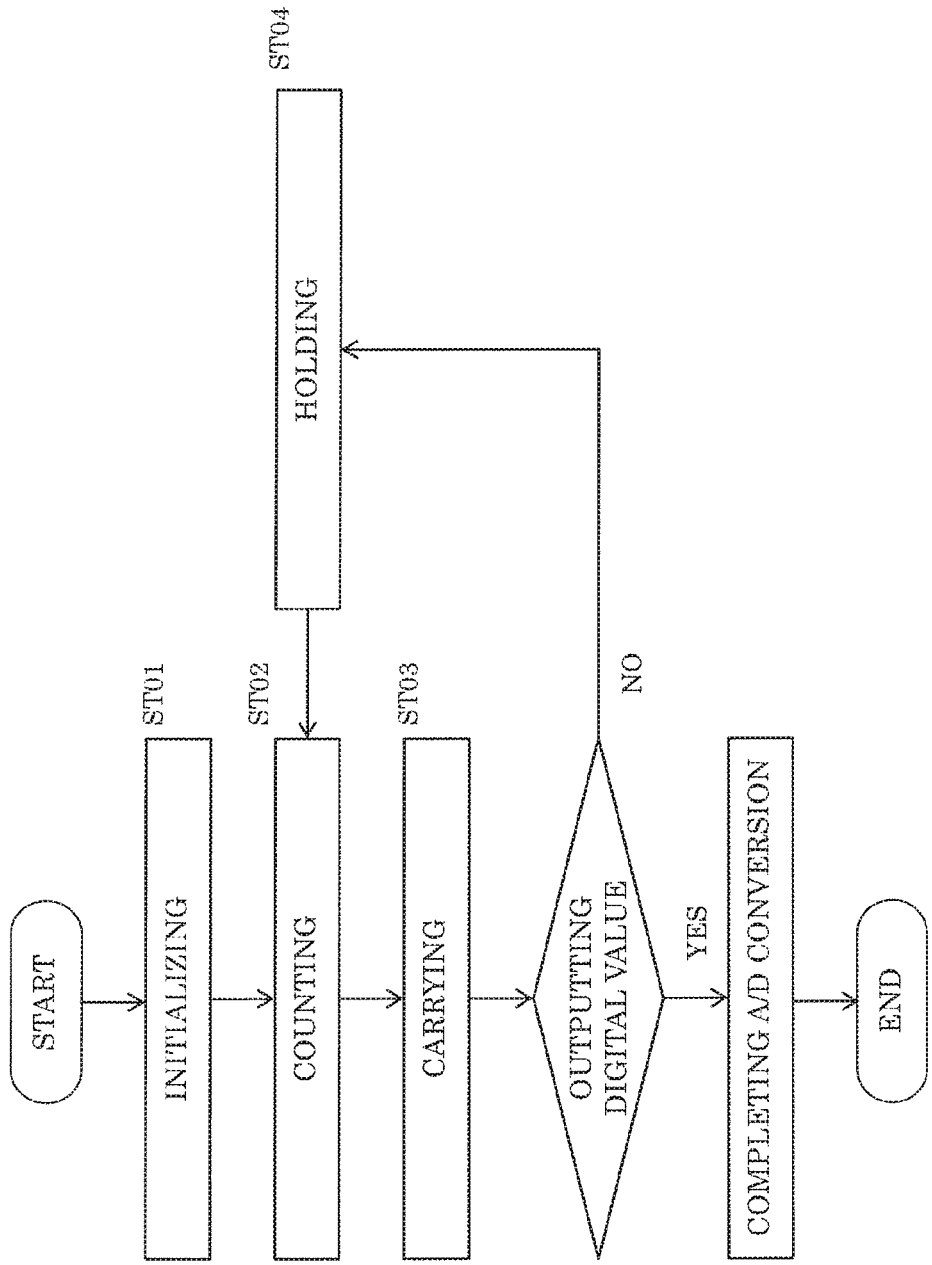

SOLID-STATE IMAGING DEVICE AND IMAGING SYSTEM

CROSS REFERENCE TO RELATED APPLICATIONS

This application is a U.S. continuation application of PCT International Patent Application Number PCT/JP2018/041127 filed on Nov. 6, 2018, claiming the benefit of priority of Japanese Patent Application Number 2017-229407 filed on Nov. 29, 2017, the entire contents of which are hereby incorporated by reference.

BACKGROUND

1. Technical Field

The present disclosure relates to solid-state imaging devices and imaging systems.

2. Description of the Related Art

An increase in speed and precision is required for A/D conversion circuits included in MOS sensors.

To achieve this, the solid-state image sensor disclosed in Japanese Unexamined Patent Application Publication No. 2010-258806 includes a latch circuit which latches phase information of at least one clock signal when the level of a signal, which is to be inverted according to a state, is inverted; at least one conversion circuit which converts latch phase information of the latch circuit to a pulse string according to a pulse signal; and a ripple counter which converts phase information of a clock to a binary code using the pulse obtained through conversion by the conversion circuit as a count clock. As above, lower bits of pixel data are generated from the phase information to increase the precision of the pixel data.

SUMMARY

However, in the conventional technique disclosed in Japanese Unexamined Patent Application Publication No. 2010-258806, when the phase information is converted to the binary value, the phase information of the clock signal is converted to the pulse string using the pulse signal. For this reason, a plurality of pulses is needed, and thus, it takes a long time to convert the phase information to the binary value.

In consideration of the problems above, an object of the present disclosure is to provide a solid-state imaging device which enables higher speed conversion of phase information to a binary value and accumulation, that is, repeated addition of pixel data with a small-sized circuit.

To solve the problems above, the solid-state imaging device according to the present disclosure includes a first converter which converts an analog signal representing a pixel value to an upper bit of a digital signal including the upper bit and a lower bit; and a second converter which converts the analog signal to the lower bit of the digital signal. The second converter includes a first latch circuit which latches, as phase information, a plurality of clock signals upon conversion to the upper bit in the first converter, the plurality of clock signals having different phases; a conversion circuit which generates the lower bit of the digital signal by converting the phase information to a binary value; an adder; and a second latch circuit which latches an addition result of the adder, and the adder adds the binary value converted by the conversion circuit and a value latched by the second latch circuit.

According to the present disclosure, the phase information of the clock is converted to a binary value without using a pulse string, resulting in a solid-state imaging device operating at higher speed. Moreover, accumulation to repeatedly perform addition with two latch circuits and one adder is enabled. For this reason, even if the numbers of pixels and frame bits and the bit width to be converted are increased, such a solid-state imaging device can perform high speed processing with high image quality while an increase in circuit size is prevented.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 4 is a table showing the input/output relation of the conversion circuit;

FIG. 5 is a table showing the input/output relation of the adder;

FIG. 7 is a flowchart illustrating examples of operation of A/D conversion in Embodiments 1 and 2.

DETAILED DESCRIPTION OF THE EMBODIMENTS

Embodiment 1

Embodiments will now be described with reference to the drawings. The embodiments below are essentially preferred examples, and are not intended to limit the present disclosure, its applications, and the range of the applications.

Since components given identical referential numbers in the embodiments operate similarly, the duplication of the description thereof will be omitted.

Figure 1A:
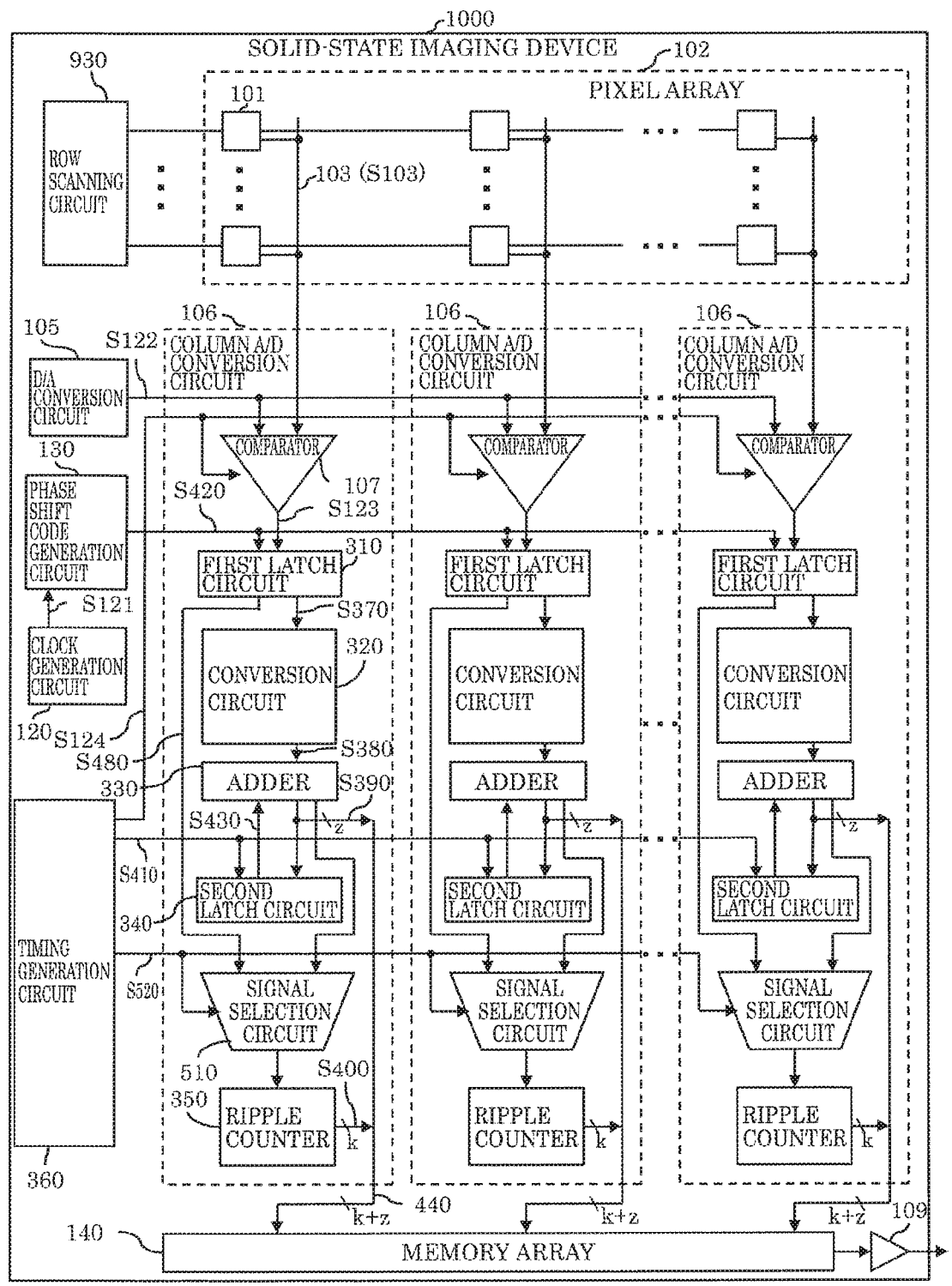
FIG. 1A is a block diagram illustrating a configurational example of the solid-state imaging device according to Embodiment 1.
Figure 1B:
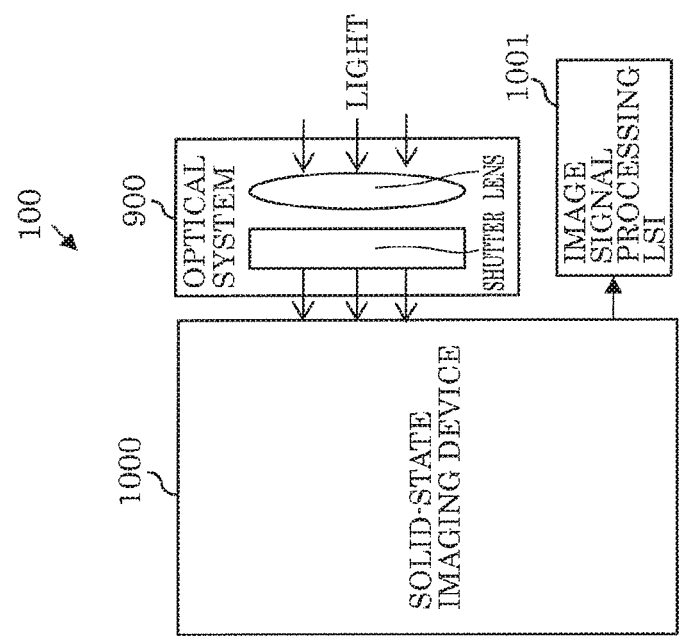
FIG. 1B is a block diagram illustrating a configuration of the imaging system according to Embodiment 1.

FIG. 1A is a block diagram illustrating a configurational example of solid-state imaging device 1000 according to Embodiment 1. FIG. 1B is a block diagram illustrating a configurational example of imaging system 100 according to Embodiment 1. As illustrated in FIG. 1B, imaging system 100 includes optical system 900, solid-state imaging device 1000, and image signal processing LSI 1001 (image signal processor).

Optical system 900 includes lens 901 and mechanical shutter 902. Lens 901 converges light (such as visible light) from a target object to form an image on an imaging region of solid-state imaging device 1000. Mechanical shutter 902 is located on the light path between lens 901 and solid-state imaging device 1000 to control light quantity to be guided to the imaging region.

Image signal processor 1001 is an external LSI which performs a variety of signal processings (image processings) on the digital data output from solid-state imaging device 1000.

Solid-state imaging device 1000 illustrated in FIG. 1A includes pixel array 102, column A/D conversion circuits 106, row scanning circuit 930, D/A conversion circuit 105, clock generation circuit 120, phase shift code generation circuit 130, timing generation circuit 360, and memory array 140.

Pixel array 102 includes pixels 101 arranged into a matrix. Here, each pixel 101 has a photosensitive element such as a photodiode or a photogate, a photoelectric converting element made of amorphous silicon, such as a photoelectric conversion film or an organic photoelectric conversion film, and a device structure for reading out the signal generated through photoelectric conversion, for example. Each pixel 101 includes a photoelectric converting element, a transfer transistor, a reset transistor, and an amplification transistor, for example.

Each of column A/D conversion circuits 106 is disposed per a column of pixel 101 or per a group of columns thereof. Each of column A/D conversion circuits 106 converts an analog signal output from pixel 101 to a digital signal, and holds the converted digital signal. FIG. 1A illustrates an example in which column A/D conversion circuit 106 is disposed per a column. The configuration of these column A/D conversion circuits 106 will be described later. Solid-state imaging device 1000 also includes a column scanner which controls such that the digital signals converted and held by column A/D conversion circuits 106 are sequentially output from output buffer 109.

D/A conversion circuit 105 generates analog ramp voltage S122 (triangle wave). Analog ramp voltage S122 is input to comparator 107 of column A/D conversion circuit 106.

Row scanning circuit 930 reads out and scans the signal from pixel 101 in unit of row.

Common write bus 440 is an output signal bus which transmits the digital signal output from column A/D conversion circuit 106. Addition result signal S390 has a width of z bits (where z is a positive integer), and count signal S400 has a width of k bits (where k is a positive integer). The digital data having a width of (k+z) bits in total is written in memory array 140 via common write bus 440. The pixel data (digital signal) subjected to A/D conversion is output through output buffer 109 to image signal processing LSI 1001. In image signal processing LSI 1001, the input pixel data is subjected to a variety of signal processings to display an image on the display of a camera, for example.

Clock generation circuit 120 feeds clock signal S121 as a reference clock signal to phase shift code generation circuit 130.

Phase shift code generation circuit 130 generates (m−1) (where m is a natural number of 2 or more) clock signals each having a phase π/m shifted from that of clock signal S121, and outputs m clock signals including clock signal S121. m Clock signals are referred to as group S420 of different-phase clock signals. In the present embodiment, m is 4, and group S420 of different-phase clock signals output by phase shift code generation circuit 130 includes clock signal S121 and three clock signals π/4, π/2, and 3π/4 shifted from that of clock signal S121. In phase shift code generation circuit 130, group S420 of 4-bit different-phase clock signals (PSCK) is generated from clock signal S121, and is output.

Figures 2A, 2B:
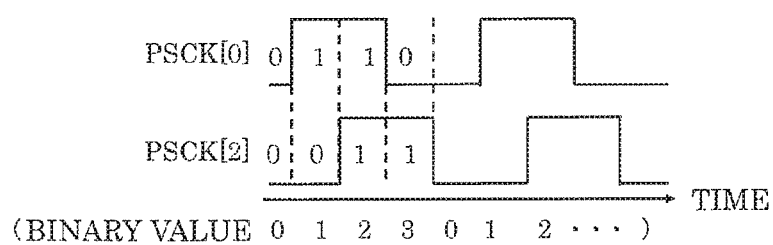
FIG. 2A is a diagram illustrating the correspondence relation between the binary value and the phase shift code where P is 2.
FIG. 2B is a diagram illustrating two clock signals output as a phase shift code where P is 2.
Figures 2C, 2D:
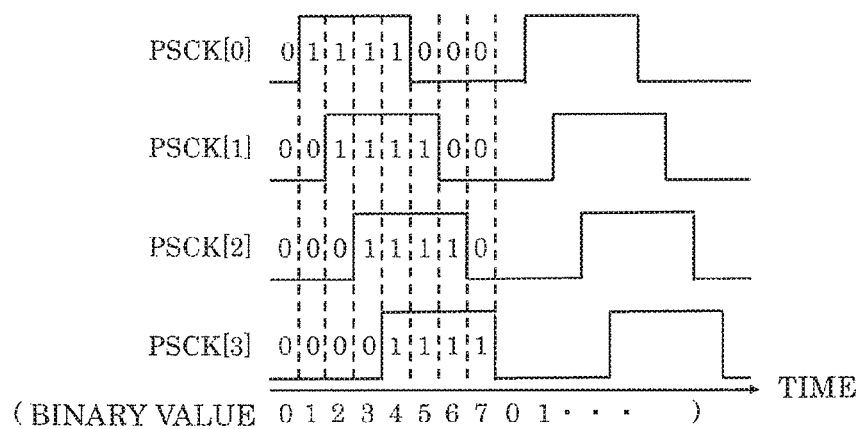
FIG. 2C is a diagram illustrating the correspondence relation between the binary value and the phase shift code where P is 4.
FIG. 2D is a diagram illustrating four clock signals output as a phase shift code where P is 4.

Group S420 of different-phase clock signals output by phase shift code generation circuit 130 is a phase shift code. In this specification, the term "phase shift code" refers to a code which corresponds to a binary value and is expressed as a binary number such that only one bit changes in one increment or decrement of the binary value and its bits sequentially change from a lower bit to an upper bit as the value increases. In other words, in a phase shift code where the bit width is P, an increment of 1 sequentially occurs such that "all of the bits are 0"→"only the lowest bit is 1"→"only the lower 2 bits are 1", . . . ; when all the bits are 1, in turn, an increment of 0 sequentially occurs such that "only the lowest bit is 0"→"only the lower 2 bits are 0", . . . , and then all the bits return to 0. Accordingly, 2P of patterns in total can be distinguished by the phase shift code. For example, FIG. 2A is a diagram illustrating the correspondence relation between the binary value and the phase shift code where P is 2. FIG. 2B is a diagram illustrating two clock signals output as the phase shift code where P is 2. FIG. 2C is a diagram illustrating the correspondence relation between the binary value and the phase shift code where P is 4. FIG. 2D is a diagram illustrating four clock signals output as the phase shift code where P is 4. In the present embodiment, as described above, phase shift code generation circuit 130 is an example where m is 4 (that is, P is 4). Clock signal S121 is output for PSCK[O] of group S420 of different-phase clock signals. For PSCK[1], a clock signal having a phase π/4 shifted from that of clock signal S121 in the same cycle is output. For PSCK[2], a clock signal having a phase π/2 shifted from that of clock signal S121 in the same cycle is output. For PSCK[3], a clock signal having a phase 3π/4 shifted from that of clock signal S121 in the same cycle is output.

Timing generation circuit 360 switches the operational mode of solid-state imaging device 1000, and generates a control signal for control of clock generation circuit 120, a control signal for reading of signals from pixel 101, and a control signal for column A/D conversion circuit 106. Timing generation circuit 360 also feeds a variety of control signals to row scanning circuit 930 and clock generation circuit 120.

Details of column A/D conversion circuit 106 will now be described.

Figure 3:
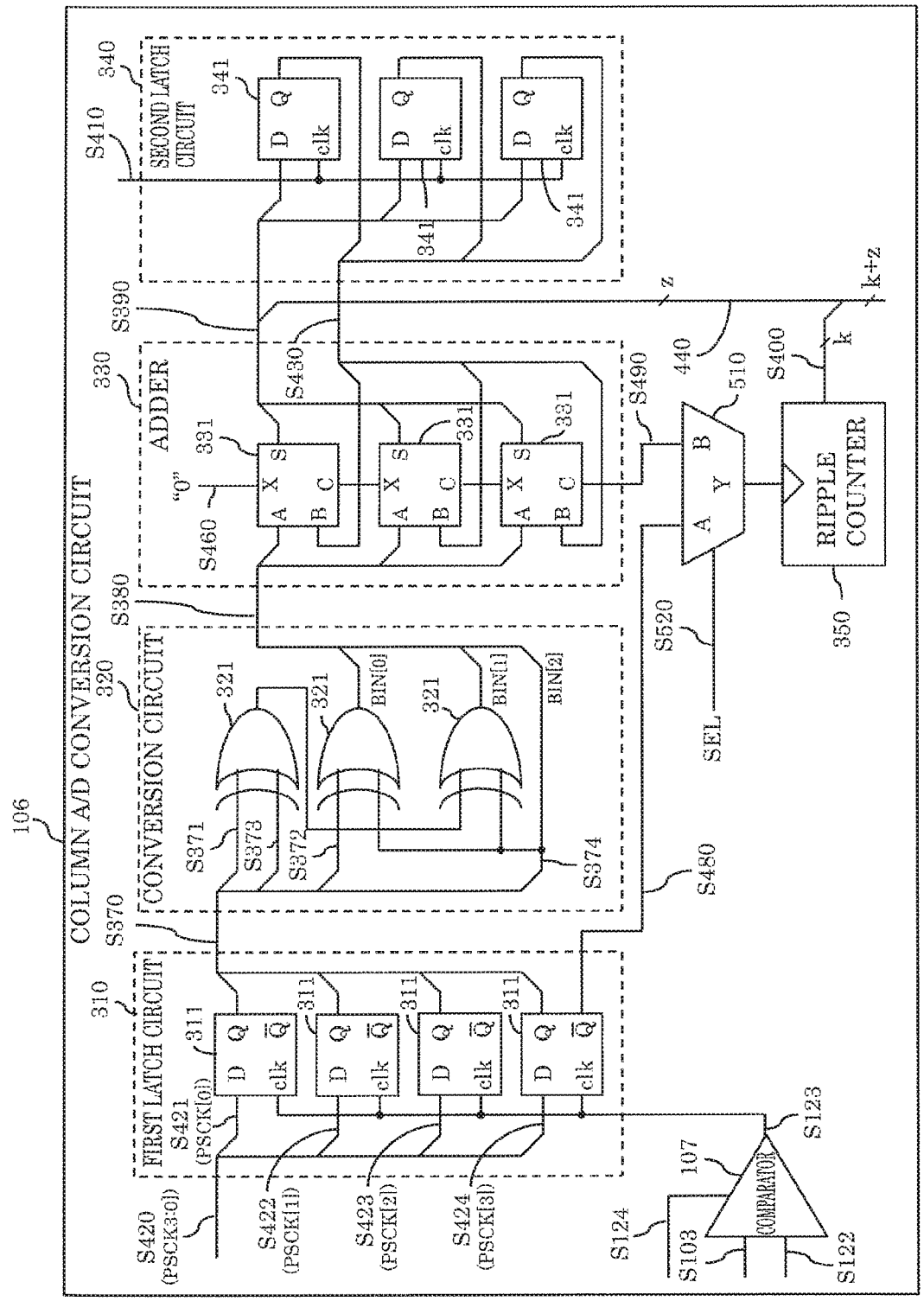
FIG. 3 is a block diagram illustrating the details of a configurational example of the column A/D conversion circuit according to Embodiment 1.

FIG. 3 is a block diagram illustrating the details of a configurational example of column A/D conversion circuit 106 according to Embodiment 1. Each column A/D conversion circuit 106 includes comparator 107, first latch circuit 310, conversion circuit 320, adder 330, second latch circuit 340, ripple counter 350, and signal selection circuit 510. FIG. 3 illustrates an example of the circuit where the phase information at m=4, i.e., that of group S420 of four different-phase clock signals is converted to a binary value.

In FIG. 3, the circuit including comparator 107, latch circuit 311, signal selection circuit 510, and ripple counter 350 forms a first converter which converts an analog signal representing a pixel value to upper bits of a digital signal having upper bits and lower bits. In FIG. 3, the circuit including first latch circuit 310, conversion circuit 320, adder 330, and second latch circuit 340 forms a second converter which converts the analog signal to the lower bits of the digital signal.

Comparator 107 compares pixel signal S103 as a signal voltage, which is an analog signal from pixel 101, to an analog ramp signal as a reference voltage, and outputs the result of comparison. For this reason, as illustrated in FIG. 3, comparator 107 includes one inputter connected to read signal line 103 in the corresponding column, and pixel signal S103 is input to the one inputter via read signal line 103. Analog ramp voltage S122 is input to another inputter of comparator 107 as a reference potential generated by D/A conversion circuit 105. Furthermore, count start signal S124 is also input from timing generation circuit 360 to comparator 107. Count start signal S124 is a signal for setting the output of comparator 107 to 1'b1 at the start of counting. Here, 1'b1 indicates that the value of a 1-bit signal is at a high level (H level).

First latch circuit 310 includes the same number of latch circuits 311 as that of group S420 of different-phase clock signals. The present embodiment is an example in which first latch circuit 310 includes four latch circuits 311. Group S420 of different-phase clock signals includes different-phase clock signal S421, different-phase clock signal S422 having a phase π/4 shifted from different-phase clock signal S421, different-phase clock signal S423 having a phase π/2 shifted therefrom, and different-phase clock signal S424 having a phase 3π/4 shifted therefrom. Comparison result signal S123 is input as the clock input of first latch circuit 310, and group S420 of different-phase clock signals is input to input D. Output Q of first latch circuit 310 outputs the phase information of group S420 of different-phase clock signals when comparison result signal S123 is inverted from the H level (1'b1) to the L level (1'b0).

Conversion circuit 320 is a circuit which converts the phase information of group S420 of different-phase clock signals to a binary value. FIG. 3 illustrates an example of a circuit which converts the phase information of four different-phase clock signals to a 3-bit binary value. Conversion circuit 320 includes three XOR circuits 321. FIG. 4 a diagram illustrating the input/output relation in conversion circuit 320. As illustrated in FIG. 4, conversion circuit 320 outputs a 3-bit binary signal for the four different-phase clock signals. In the present embodiment, first latch output signal S370 having the 4-bit phase information of the different-phase clock signals is input, and a 3-bit binary conversion signal S380 is output.

Adder 330 includes one or more full adders 331. The present embodiment is an example in which three full adders 331 are provided for the 3-bit binary value. Full adder 331 includes input A, input B, and carry input X as three input terminals, and addition result S and carry output C as two output terminals. FIG. 5 is a table showing the input/output relation of adder 330. As shown in FIG. 5, addition result S and carry output C are determined according to the values of the three input terminals. Addition of any number of bits is enabled by connecting carry output C of a lower bit of full adder 331 to carry input X of an upper bit thereof. In the present embodiment, addition of 3 bits is enabled. Carry input signal S460 of the lowest bit is fixed at the L level (1'b0). Binary conversion signal S380 is input to input A of full adder 331, and output Q from second latch circuit 340 (described later) is input to input B. Addition result signal S390 has a width of 3 bits, and is connected to input D of second latch circuit 340 and common write bus 440. Carry output signal S490 of the uppermost bit is connected to signal selection circuit 510.

Second latch circuit 340 includes D type flipflops 341, and functions as an accumulator which enables accumulation, i.e., repeated addition together with adder 330. The present embodiment is an example in which three D type flipflops 341 are provided for the 3-bit binary value. Addition result signal S390 of adder 330 is input to input D of D type flipflop 341, and latch control clock signal S410 generated in timing generation circuit 360 is input to the clock input. When latch control clock signal S410 is inverted from the L level (1'b0) to the H level (1'b1), addition result signal S390 is output from output Q as second latch output signal S380. D type flipflop includes a reset terminal (not illustrated), and sets the internal state to the initial value when initialization signal S125 is inverted from L level (1'b0) to H level (1'b).

Figures 6A, 6B:
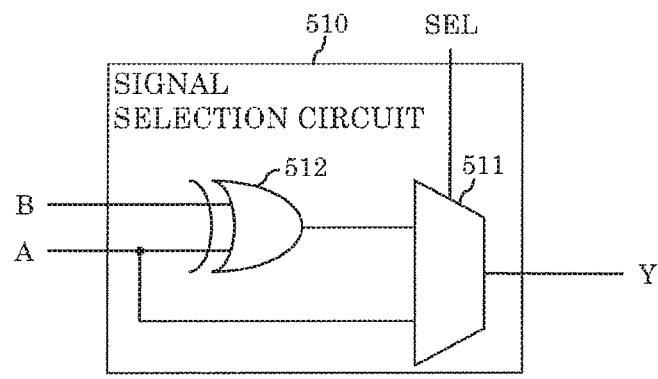
FIG. 6A is a circuit diagram illustrating a configurational example of the signal selection circuit.
FIG. 6B is a table showing the input/output relation of the signal selection circuit.

FIG. 6A illustrates a circuit diagram illustrating a configurational example of signal selection circuit 510. As illustrated in FIG. 6A, signal selection circuit 510 includes selector circuit 511 and XOR circuit 512, and includes two input terminals (A and B), one switch terminal (S), and one output terminal (Y). The input terminal is selected according to the signal input to switch terminal S, and is output from output terminal Y. Clock signal S480 for a counter is input to input terminal A, and carry output signal S490 of the uppermost bit of the adder is input to input terminal B. Selection signal S520 generated in timing generation circuit 360 is input to switch terminal S, and output terminal Y is connected to the clock input of ripple counter 350. FIG. 6B is a table showing the input/output relation of the signal selection circuit. As shown in FIG. 6B, in the case where switch terminal S is at the L level (1'b0), the signal of input terminal A is output from output terminal Y. In the case where switch terminal S is at the H level (1'b1) and input terminal B is at the H level (1'b1), in order to proceed the count of ripple counter 350, the inverted signal of input terminal A is output from output terminal Y to invert the clock input of ripple counter 350. When input terminal B is at the L level (1'b0), in order not to proceed the count of ripple counter 350, the same signal as that of input terminal A is output from output terminal Y without inverting the clock input of ripple counter 350.

Ripple counter 350 counts clock signal S480 for a counter, and holds the count value, as count signal S400, when comparison result signal S123 is inverted from the H level (1'b1) to the L level (1'b0). Clock signal S480 for a counter is the inverted signal of different-phase clock S374. Ripple counter 350 is a k-bit (where k is a positive integer) counter which counts the rise edge of different-phase clock S374. The output of ripple counter 350 has a width of k bits, and is connected to common write bus 440.

The operation (driving method) of A/D conversion in solid-state imaging device 1000 according to Embodiment 1 will now be described in detail.

Figure 8:
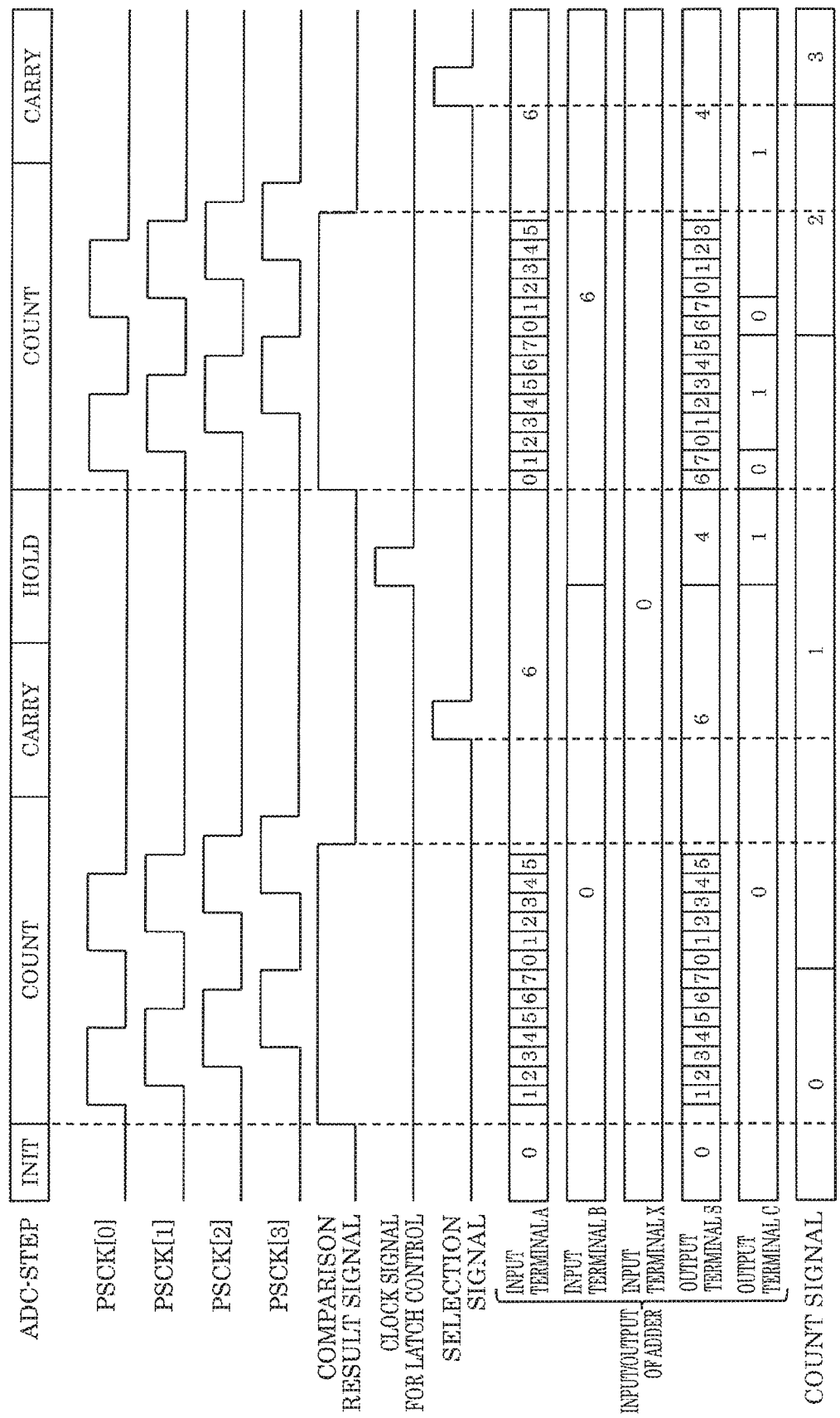
FIG. 8 is a timing chart of the signals in the column A/D conversion circuit according to Embodiment 1.

FIG. 7 is a flowchart illustrating an example of the operation of A/D conversion. FIG. 8 is a timing chart of the signals within column A/D conversion circuit 106. As illustrated in FIG. 7, the operation of A/D conversion in solid-state imaging device 1000 is performed mainly by four steps. The first step is initializing step ST01, the second step is counting step ST02, the third step carrying step ST03, and the fourth step is hold step ST04.

At the beginning, in initializing step ST01, ripple counter 350 and second latch circuit 340 within column A/D conversion circuit 106 are initialized by initialization signal S125 (not illustrated). In this step, D/A conversion circuit 105 feeds analog ramp voltage S122 to one of the inputters in comparator 107. When row scanning circuit 930 selects a predetermined row, pixel 101 in the selected row outputs pixel signal S103, and pixel signal S103 is fed to the other inputter in comparator 107. Thereby, initializing step ST01 is completed. In FIG. 8, the steps are shown in ADC-STEP, and initializing step ST01 corresponds to the period represented by INI in ADC-STEP.

In counting step ST02, count start signal S124 of timing generation circuit 360 sets the outputs of comparators 107 in all the columns to the H level (1'b1), and group S420 of different-phase clock signals generated in phase shift code generation circuit 130 is input to column A/D conversion circuits 106 in all the columns.

In a column, when the levels of two signals (pixel signal S103 and analog ramp voltage S122) input to comparator 107 are switched, comparison result signal S123 is inverted from the H level (1'b1) to the L level (1'b0). In first latch circuit 310, the phase information of group S420 of different-phase clock signals when comparison result signal S123 is inverted is held. The phase information when comparison result signal S123 is inverted is converted to a binary value via conversion circuit 320, and the converted phase information is input as binary conversion signal S380 to adder 330. Note that latch circuit 311 which latches the phase information of different-phase clock signal S421 (PSCK[0]), different-phase clock signal S422 (PSCK[1]), and different-phase clock signal S423 (PSCK[2]) in first latch circuit 310 may be a D type flipflop. Simultaneously, the count of ripple counter 350 is stopped and the count value of the fall edge of different-phase clock S374 is held in ripple counter 350. Counting step ST02 corresponds to the start of counting to the completion of the counting of all the columns. Note that counting step ST02 corresponds to the period represented by COUNT in ADC-STEP in the timing chart illustrated in FIG. 8.

Next, the processing goes to carrying step ST03. In carrying step ST03, selection signal S520 generated in timing generation circuit 360 is inverted from the L level (1'b0) to the H level (1'b1) to switch output terminal Y to input terminal B of signal selection circuit 510, and carry output signal S490 is connected to clock input of ripple counter 350. In the next step, selection signal S520 is inverted from the H level (1'b1) to the L level (1'b0) to switch output terminal Y to input terminal A of signal selection circuit 510, and clock signal S480 for a counter is connected to the clock input of ripple counter 350. In the case where carry output signal S490 is at the H level (1'b1), the rise edge and the fall edge each are generated in the clock input of ripple counter 350 one time to proceed the count value by "1". In the case where carry output signal S490 is at the L level (1'b0), the rise edge and the fall edge are not generated and the count value does not proceed. Carrying step ST03 corresponds to the period represented by CARRY in ADC-STEP in the timing chart illustrated in FIG. 8.

Figure 9:
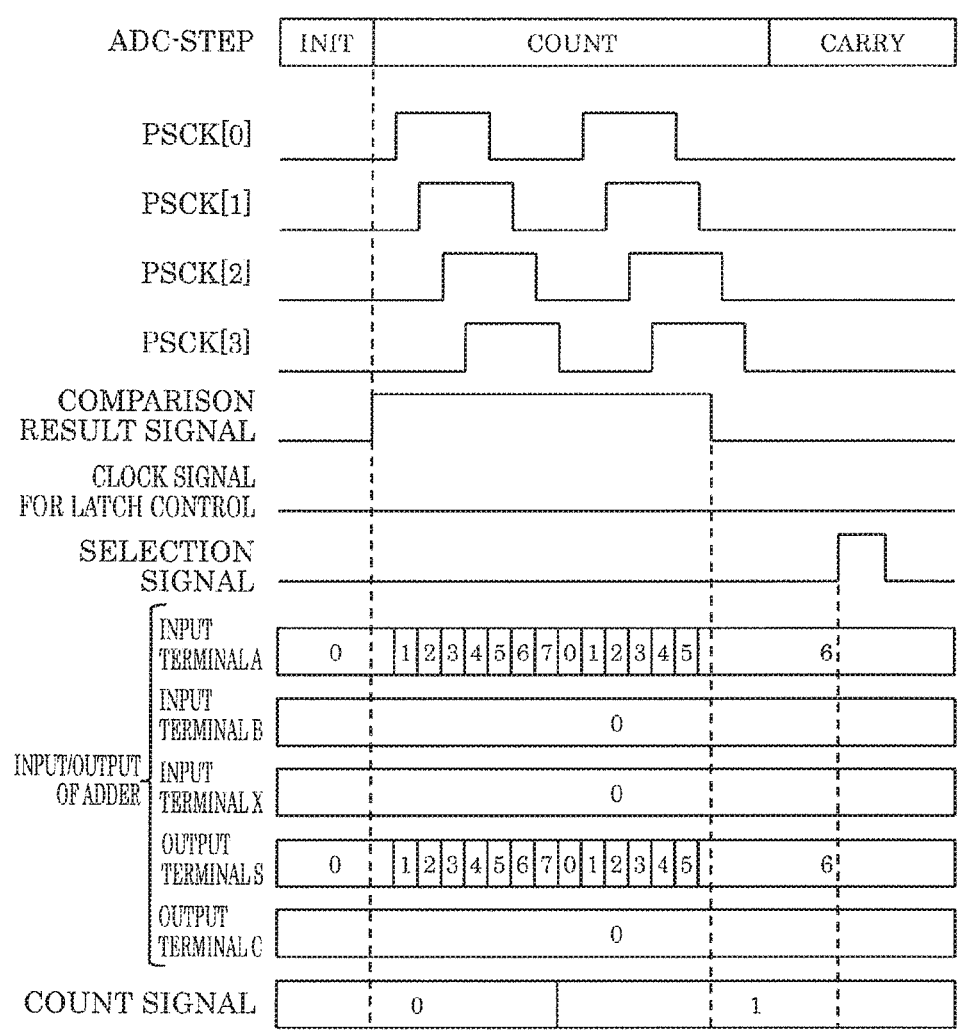
FIG. 9 is a timing chart when A/D conversion is completed in Embodiment 1.

By the above operation, pixel signal S103 (analog signal) read from pixel 101 is subjected to A/D conversion to count signal S400 (digital signal) held in ripple counter 350 and addition result signal S390 (digital signal) held in the adder. Here, when output buffer 109 outputs the A/D converted value, A/D conversion is completed. FIG. 9 is the timing chart when the A/D conversion is completed. In the example in FIG. 9, a value of 14 is output from the output from column A/D conversion circuit 106, where the lower 3 bits correspond to the value of addition result signal S390 (output terminal S), which is 6, and the upper bits correspond to the value of count signal S400 (count value), which is 1. Thereby, the bit precision which ripple counter 350 has is increased by 3 bits from adder 330.

The processing goes to hold step ST03 in the case where the next line is subsequently read out to start the count from the value held in column A/D conversion circuit 106, as when digital vertical pixel addition is performed. In FIG. 8, this corresponds to the period represented by HOLD. In hold step ST04, first, latch control clock signal S410 generated in timing generation circuit 360 is inverted from the L level (1'b0) to the H level (1'b1). Thereby, addition result signal S390 of adder 330 is held in second latch circuit 340.

When latch control clock signal S410 is inverted from the L level (1'b0) to the H level (1'b1), second latch output signal S430 where addition result signal S390 is held is input to input terminal B of adder 330. Subsequently, latch control clock signal S410 is inverted form the H level (1'b1) to the L level (1'b0). Concurrently, the initial value of analog ramp voltage S122 is fed from D/A conversion circuit 105 to one of the inputters of comparator 107. Pixel signal S103 is read out from pixel 101 in the row selected by row scanning circuit 930. Pixel signal S103 is fed to the other inputter in comparator 107, and hold step ST04 is completed.

When hold step ST04 is completed, the processing goes to counting step ST02 again. In counting step ST02, the operation in the counting step is performed as described above. After counting step ST02 is completed, the processing goes to carrying step ST03. In carrying step ST03, the carrying operation is performed as described above.

Thereafter, according to the flowchart illustrated in FIG. 7, hold step ST04, counting step ST02, and carrying step ST03 are repeated by a desired number of times (the number of times to perform digital vertical pixel addition). The digital value is read out when carrying step ST03 is completed, thereby completing the A/D conversion.

By performing the above operation, as illustrated in the timing chart in FIG. 8, the addition result is held in second latch circuit 340 at the start of recounting, and is input to input terminal B of adder 330. Accordingly, the repetition of addition is enabled by returning comparison result signal S123 of comparator 107 to the H level (1'b1) and inputting the binary value, which is obtained by conversion of pixel signal S103 in the next row, to input terminal A of adder 330.

Except for the difference in the timing to invert comparison result signal S123 among the columns, pixel signals S103 in all the columns are concurrently subjected to the operation of A/D conversion above. After the count in a predetermined bit width is completed in ripple counter 350, addition result signal S390 of adder 330 and count signal S400 of ripple counter 350 are transferred to memory array 140 by a transfer clock (not illustrated). Subsequently, addition result signal S390 and count signal S400 for each column are simultaneously read out by a column scanner (not illustrated), and are output as A/D converted values from output buffer 109.

As described above, when a lower bit is converted to a binary value, an ordinary solid-state imaging device converts the phase information to the pulse string using a pulse signal and a plurality of pulse signals are needed. In contrast, the solid-state imaging device according to Embodiment 1 eliminates such a plurality of pulse strings by concurrently output the binary values using conversion circuit 320. For example, in the case where the conversion of the 3-bit binary value is performed, the clock is unnecessary in the present embodiment while the ordinary solid-state imaging device needs eight clocks. In other words, when the conversion to a binary value of N bits (where N is a positive integer) is performed, 2N clocks are unnecessary, and thus the time needed for the conversion to the binary value can be shortened.

Moreover, to perform addition, the ordinary solid-state imaging device needs the number of latch circuits corresponding to the digital values to be held and the number of adders corresponding to the number of additions. In contrast, the solid-state imaging device according to Embodiment 1 can treat with a plurality of times of addition by connecting two latch circuits to one adder to allow feedback. For example, in the case where 3-time counts are repeatedly added, the ordinary solid-state imaging device needs three latch circuits and two adders. In contrast, the solid-state imaging device according to the present embodiment needs only two latch circuits and one adder, which results in a reduction in the area needed for the latch circuit to ⅔ and the area needed for the adder to ½.

Moreover, in the solid-state imaging device which repeatedly adds M-time (where M is an integer of 2 or more) counts, such a reduction means that the area of the latch circuit is reduced to 2/M and the area of the adder is reduced to 1/(M−1). Compared to the ordinary solid-state imaging device, the area needed for the latch circuit and the adder in the solid-state imaging device according to the present embodiment can be more significantly reduced as the number of repetitions of the counting step is increased.

In other words, even if the number of pixels, the frame rate, and the bit width to be converted are increased, the solid-state imaging device according to the present embodiment can perform high speed processing with high image quality while an increase in circuit size is prevented.

As described above, the solid-state imaging device according to the present embodiment includes a first converter which converts an analog signal representing a pixel value to an upper bit of a digital signal including the upper bit and a lower bit; and a second converter which converts the analog signal to the lower bit of the digital signal. The second converter includes first latch circuit 310 which latches, as phase information, a plurality of clock signals having different phases upon conversion to the upper bit in the first converter, conversion circuit 320 which generates the lower bit of the digital signal by converting the phase information to a binary value, adder 330, and second latch circuit 340 which latches an addition result by the adder. Adder 330 adds the binary value converted by conversion circuit 320 and the value latched by the second latch circuit.

Such a configuration enables higher speed operation because the phase information of the clock is converted to the binary value without using a pulse string. Furthermore, accumulation to repeatedly perform addition with two (first and second) latch circuits and one adder is enabled. For this reason, even if the numbers of pixels and frame bits and the bit width to be converted are increased, such a solid-state imaging device can perform high speed processing with high image quality while an increase in circuit size is prevented.

Here, the first converter may be provided as a circuit including comparator 107, latch circuit 311, selector 510, and ripple counter 350 in FIG. 3, for example.

Here, the second converter may be provided as a circuit including first latch circuit 310, conversion circuit 320, adder 330, and second latch circuit 340 in FIG. 3, for example.

Moreover, the first converter may include comparison circuit 107 which compares the level of the analog ramp signal to the level of the analog signal, and counter 350 which generates the upper bit of the digital signal from the analog signal by counting the time until the level of the analog ramp signal matches the level of the analog signal in the result of comparison.

The solid-state imaging device according to the present embodiment includes pixel 101 which receives light to perform photoelectric conversion, and A/D conversion circuit 106 which converts an analog signal from pixel 101 to a digital signal. A/D conversion circuit 106 includes comparator 107 which outputs a comparison result signal indicating a result of comparison of the voltage of the analog signal to that of the analog ramp signal; clock generation circuit 130 which generates a plurality of clock signals having different phases in the same cycle; ripple counter 350 which generates the upper bit of the digital signal by counting the time until the comparison result signal is inverted; first latch circuit 310 which latches the values of the clock signals as phase information when the comparison result signal is inverted; conversion circuit 320 which generates the lower bit of the digital signal by converting the phase information to a binary value indicating the phase difference from the reference clock signal; adder 330; and second latch circuit 340 which latches the addition result in adder 330. Conversion circuit 320 is provided as a combination circuit. Adder 330 adds the binary value converted by conversion circuit 320 and the value latched by second latch circuit 340.

Such a configuration enables higher-speed conversion of the phase information to the binary value and accumulation to repeatedly perform addition of the pixel data with a small-sized circuit.

Here, the total number of the plurality of clock signals is m clock signals, where m is an integer of 2 or more. First latch circuit 310 may latch m-bit phase information.

Here, adder 330 may include (m−1) full adders 331, and second latch circuit 340 may latch an (m−1)·bit addition result as the addition result in adder 330.

Here, conversion circuit 320 may convert phase information including $2^{(m-1)}$ different phases to an (m−1)·bit binary value.

Here, ripple counter 350 may generate the upper bit of the digital signal by counting the time from the start of a change in the analog ramp signal to the inversion of the comparison result signal using the reference clock signal in the plurality of clock signals.

Here, signal selection circuit 510 may be included, which switches the signal to be input to the clock inputter of ripple counter 350 between the clock signal for a counter and the carry signal of the uppermost bit in the adder according to the control signal.

In Embodiment 1, the pixel can have any configuration. For example, a variety of configurations can be used, such as those having a structure for rear surface irradiation, those including an organic photoelectric conversion film, and those having a large pixel size. In the case where the pixel has a configuration such that light use efficiency in pixel 101 (photosensitive element) is increased as in the configurations having a structure for rear surface irradiation, those including an organic photoelectric conversion film, and those having a large pixel size, the amount of the readout signal (analog signal) from pixel 101 is increased, as a result, increasing the time needed for A/D conversion. In the embodiments, the precision of the bits after A/D conversion can be increased while the time needed for A/D conversion is maintained. Accordingly, more significant effects can be expected in such configurations of the pixel.

Although optical system 900 includes a mechanical shutter in the description of the embodiments, the effects described herein are not affected by optical system 900 without such a mechanical shutter.

Embodiment 2

The differences of the configuration and operation of the solid-state imaging device according to Embodiment 2 from those of Embodiment 1 will now be mainly described with reference to the drawings.

Figure 10:
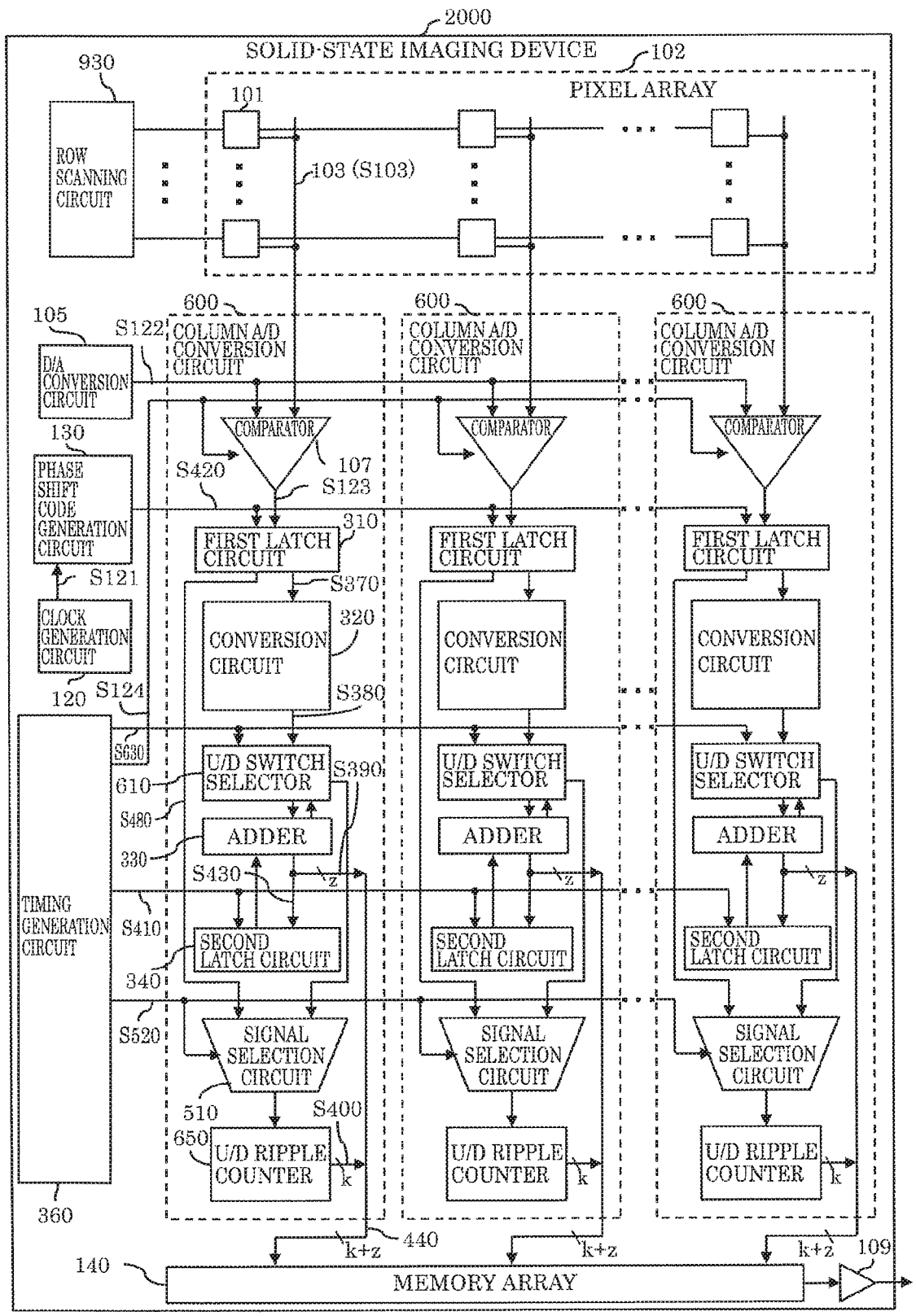
FIG. 10 is a block diagram illustrating a configurational example of the solid-state imaging device according to Embodiment 2.

FIG. 10 is a block diagram illustrating a configurational example solid-state imaging device 2000 according to Embodiment 2. As illustrated in FIG. 10, column A/D conversion circuit 106 in solid-state imaging device 1000 illustrated in FIG. 1A is replaced by column A/D conversion circuit 600 in solid-state imaging device 2000 according to Embodiment 2. Accompanied by this modification, timing generation circuit 360 also has a modified configuration. As illustrated in FIG. 10, column A/D conversion circuit 600 is also provided for each column in the present embodiment.

Figure 11:
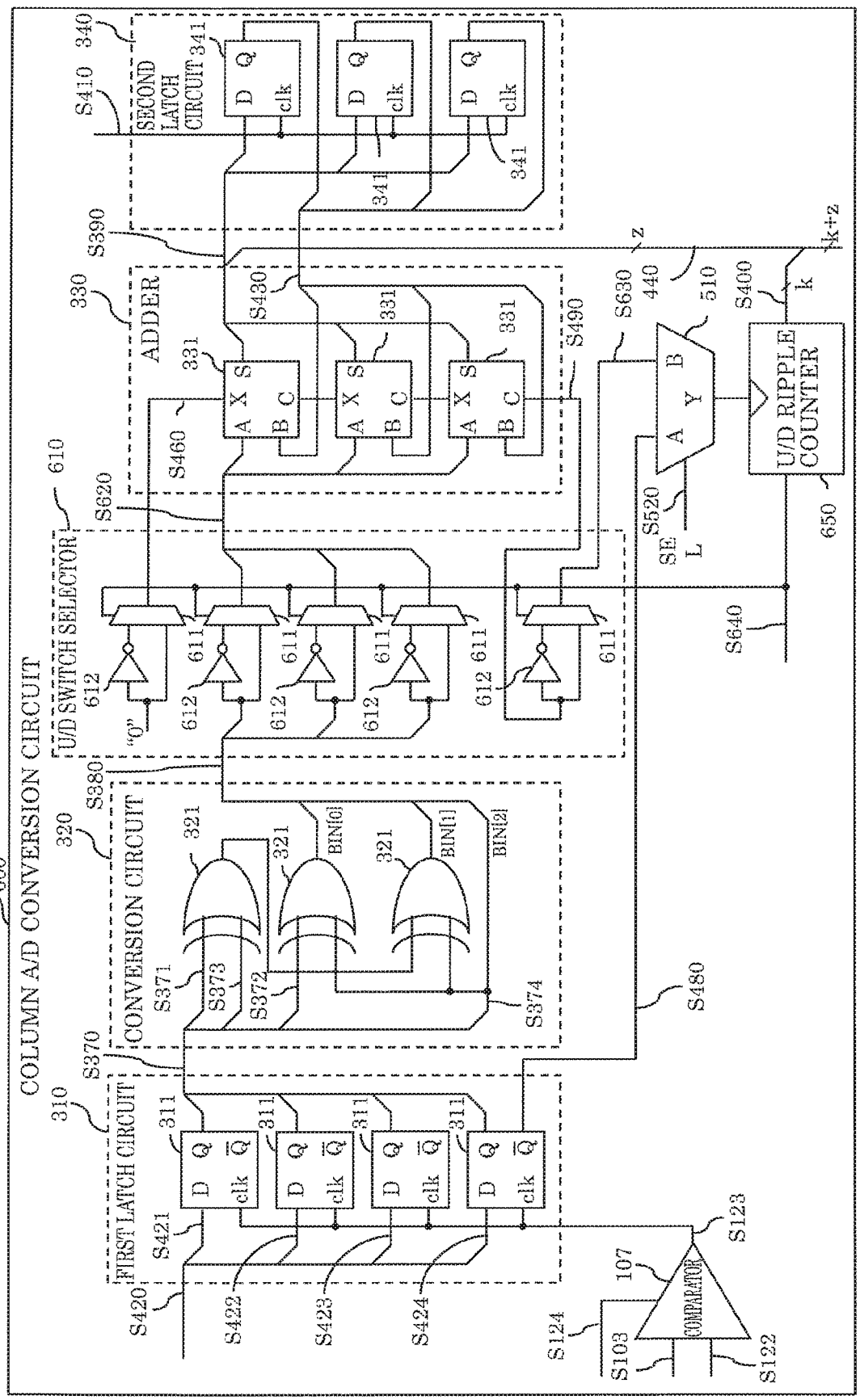
FIG. 11 is a block diagram illustrating the details of a configurational example of the column A/D conversion circuit according to Embodiment 2.

FIG. 11 is a block diagram illustrating the details of a configurational example of column A/D conversion circuit 600 according to Embodiment 2. Column A/D conversion circuit 600 includes comparator 107, first latch circuit 310, conversion circuit 320, adder 330, second latch circuit 340, signal selection circuit 510, U/D switch selector (inversion selector) 610, and U/D ripple counter 650.

U/D switch selector 610 includes a plurality of selector circuits 611 and a plurality of inverter circuits 612. According to U/D control signal S640 generated in timing generation circuit 360, binary conversion signal S380, carry output signal S490, and carry input signal S460 are inverted or reinverted. FIG. 11 illustrates an example of a 5-bit signal including a 3-bit binary conversion signal, a 1-bit carry output signal, and a 1-bit carry input signal. In the case where subtraction of the digital signal is performed as in digital correlated double sampling (CDS), to make binary conversion signal S380 a complement of 2, U/D control signal S640 is set at the L level (1′b0), and binary conversion signal S380 is inverted via inverter circuit 612. Furthermore, to add "1", the fixed input "0" of carry input signal S460 in adder 330 is inverted and "1" is input. To perform carry down when subtraction is performed, carry signal S490 is inverted via inverter circuit 612. In the case of reinversion, the U/D control signal is set at the H level (1′b1) and binary conversion signal S380, which is reinverted, is output as it is.

U/D ripple counter 650 performs count up or count down according to U/D control signal S640. U/D ripple counter 650 counts clock signal S480 for a counter, and holds the count value when comparison result signal S123 is inverted. U/D ripple counter 650 performs count down in the case where the U/D control signal is at the L level (1′b0), and performs count up in the case where the U/D control signal is at the H level (1′b1).

The details of the operation (driving method) of A/D conversion of solid-state imaging device 1000 according to Embodiment 2 will now be described. The operation of A/D conversion in solid-state imaging device 2000 is performed according to the flowchart in FIG. 7 as in Embodiment 1.

Figure 12:
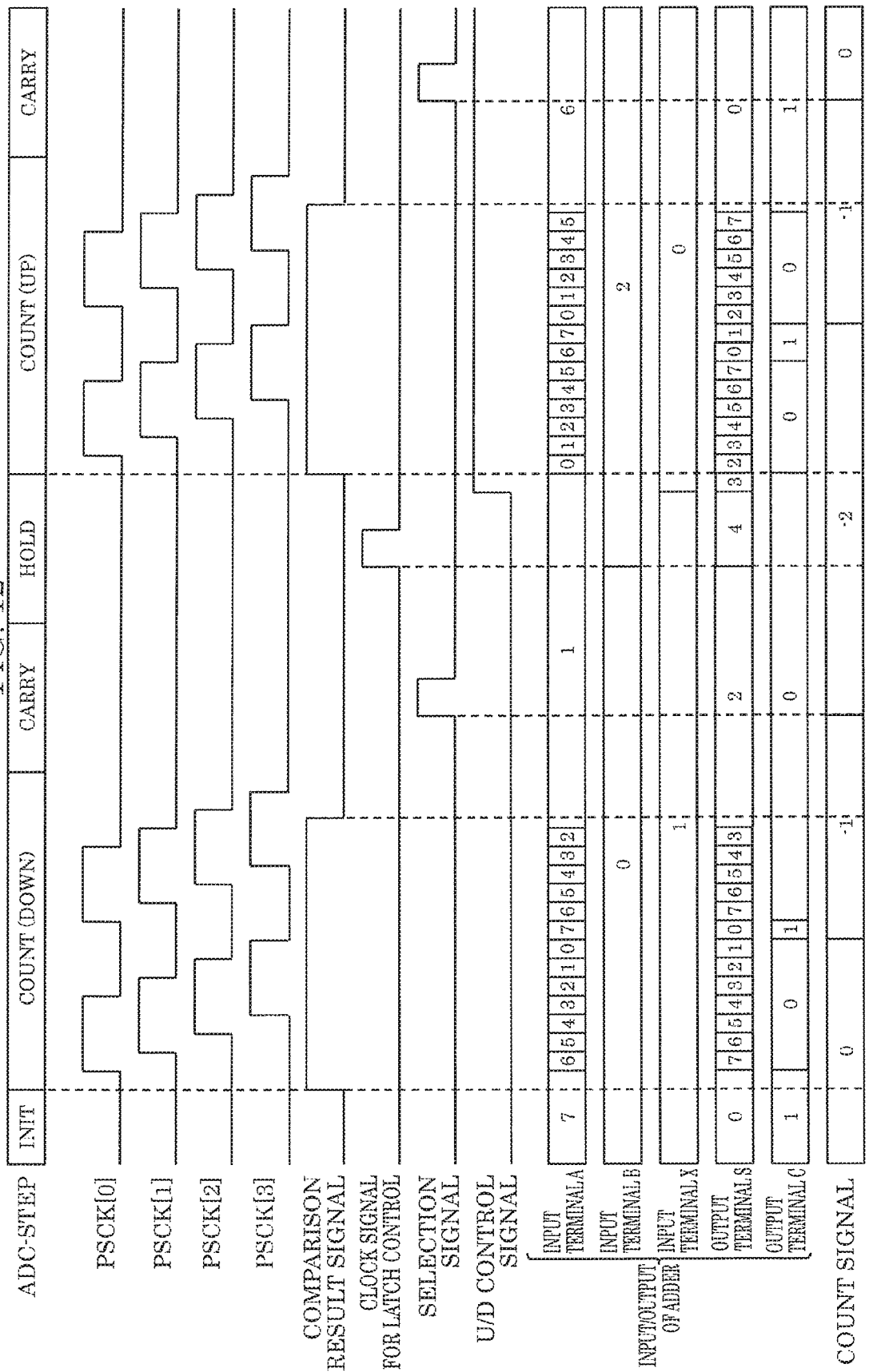
FIG. 12 is a timing chart of the signals in the column A/D conversion circuit according to Embodiment 2.

FIG. 12 is a timing chart of the signals in column A/D conversion circuit 600 according to Embodiment 2. FIG. 12 illustrates the timing chart where m is 4 when the processing goes from initializing step ST01 to counting step ST02 (count down), carrying step ST03, hold step ST04, counting step ST02 (count up), and carrying step ST03.

The value of U/D control signal S640 should be fixed to ensure the operation of U/D ripple counter 650 during initializing step ST01. Accordingly, in initializing step ST01, the value of U/D control signal S640 is fixed in addition to the operation of initializing step ST01 in Embodiment 1. Here, counting step ST02 after initializing step ST01 is in the count down state. Accordingly, during initializing step ST01, timing generation circuit 360 fixes U/D control signal S650 to the value of the L level (1′b0). In the case where count up is performed in counting step ST02 after initializing step ST01, timing generation circuit 360 is configured to fix the value of U/D control signal S640 to the H level (1′b1) during initializing step ST01. The operations of initializing step ST01 other than these are as described in Embodiment 1.

After initializing step ST01 is completed, the processing goes to counting step ST02. In the case where U/D control signal S640 is at the L level (1′b0), the count down operation is performed. Binary conversion signal S380 is inverted via U/D switch selector 610, and is input to input terminal A of adder 330. The H level (1′b1) inverted from the L level (1′b0) is input to carry input signal S460 of the lowest bit of adder 330. Thereby, the complement of 2 of binary conversion signal S380 is input to adder 330 to enable subtraction of the lower bit as count down.

In the case where U/D control signal S640 is at the L level (1′b0), U/D ripple counter 650 continues count down until comparison result signal S123 is inverted, and holds the count value when comparison result signal S123 is inverted. In FIG. 12, the fall edge is counted. The operations of counting step ST02 other than these are as described in Embodiment 1.

After counting step ST02 is completed, the processing goes to carrying step ST03. In the case where U/D control signal S640 is at the L level (1′b0), carry output signal S490 in adder 330 is inverted, and is input to signal selection circuit 510. To perform carry up or carry down, selection signal S520 is inverted from the L level (1′b0) to the H level (1′b1) to perform switch to carry output signal. Again, selection signal S520 is switched from the H level (1′b1) to the L level (1′b0) to perform switch to clock S480 for a counter. In the case where U/D control signal S640 is at the L level (1′b0) and carry output signal S490 is at the L level (1'b0), the count of U/D ripple counter 650 is put back by "1". Accordingly, the operation is performed as carry down in the case of the count down operation where U/D control signal S640 is at the L level (1'b0).

In the case where U/D control signal S640 is at the H level (1'b1), carry output signal S490, which is non-inverted, is input to signal selection circuit 510. In the case where U/D control signal S640 is at the H level (1'b1) and carry output signal S490 is at the H level (1'b1), the count of U/D ripple counter 650 proceeds by "1". Accordingly, the operation is performed as carry up in the case of the count up operation where U/D control signal S640 is at the H level (1'b0). Other operations are as described in carrying step ST03 according to Embodiment 1.

Figure 13:
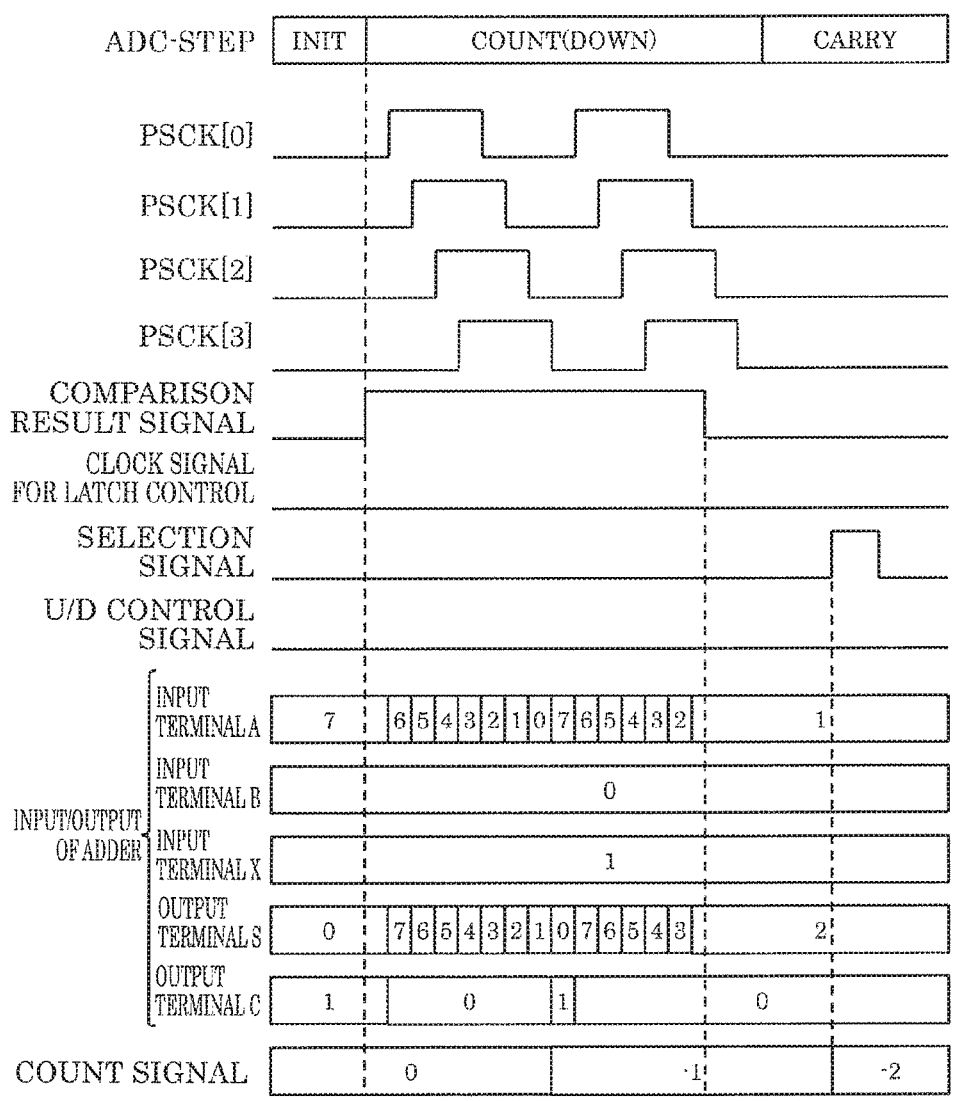
FIG. 13 is the timing chart when A/D conversion is completed in Embodiment 2.

Through the operations above, pixel signal S103 (analog signal) read from pixel 101 is A/D converted to count signal S400 (digital signal) held in U/D ripple counter 650 and addition result signal S390 (digital signal) held in the adder. Here, when the A/D converted value is output from output buffer 109, A/D conversion is completed. FIG. 13 is the timing chart when A/D conversion is completed. In the example of FIG. 13, a value of −14 is output from column A/D conversion circuit 600, where the lower 3 bits correspond to the value of addition result signal S390 (output terminal S), which is 2, and the upper bits correspond to the value of count signal S400 (count value), which is −2, and the count down operation is implemented. Thereby, the bit precision which U/D ripple counter 650 has is increased by 3 bits from adder 330.

As in the so-called digital correlated double sampling (digital CDS) in which a reset level read from a pixel is subtracted as off-set from a signal level read from the pixel is performed, when the charge readout signal (pixel signal S103; analog signal) is subsequently input to start count from the value held in column A/D conversion circuit 600, the processing goes to hold step ST04. In FIG. 12, this corresponds to a period represented by HOLD. As in Embodiment 1, in hold step ST04, first, timing generation circuit 360 inverts latch control clock signal S410 from the L level (1'b0) to the H level (1'b1), and addition result signal S390 is held in second latch circuit 340. Subsequently, latch control clock signal S410 is inverted from the H level (1'b1) to the L level (1'b0).

When switching between count down and count up is performed, U/D control signal S640 is inverted. In FIG. 12, U/D control signal S640 is inverted from the L level (1'b0) to the H level (1'b0) to perform switch from count down to count up. By inverting U/D control signal S640 to the H level (1'b1), binary conversion signal S380 is switched from the inverted state to the non-inverted state, and carry input signal S460 of adder 330 is switched from the H level (1'b1) to the L level (1'b0). Other operations are as described in hold step ST04 according to Embodiment 1.

When hold step ST04 is completed, the processing again goes to counting step ST02 as in Embodiment 1. In counting step ST02, the operations in the counting step are performed as described above. After counting step ST02 is completed, the processing goes to carrying step ST03. In carrying step ST03, the carry operation is performed as described above.

Thereafter, according to the flowchart illustrated in FIG. 7, hold step ST04, counting step ST02, and carrying step ST03 are repeated by a desired number of times (the number of times to perform digital CDS and digital vertical pixel addition). The A/D conversion is completed by reading out the digital value when carrying step ST03 is completed.

By performing the operation above, as illustrated in the timing chart in FIG. 12, the addition result or the subtraction result is held in second latch circuit 340 at the start of recounting, and is input to input terminal B in adder 330. Accordingly, repetition of addition/subtraction is enabled by returning comparison result signal S123 of comparator 107 to the H level (1'b1) and inputting the binary value of another pixel signal S103 to input terminal A of the adder.

Except for the difference in the timing to invert comparison result signal S123 among the columns, the above operation of A/D conversion is concurrently performed on pixel signals S103 of all of the columns. After the count with a predetermined bit width is finished in U/D ripple counter 650, addition result signal S390 of adder 330 and count signal S400 of U/D ripple counter 650 are transferred to memory array 140 by a transfer clock (not illustrated). Subsequently, addition result signal S390 and count signal S400 for each column are simultaneously read out by a column scanner (not illustrated), and are output as A/D converted values from output buffer 109.

As described above, the solid-state imaging device according to Embodiment 2 includes U/D switch selector 610 and U/D ripple counter 650 in column A/D conversion circuit 600. Such a configuration enables a reduction in area of the circuit even if count up or count down is repeated several times. In other words, in the solid-state imaging device which repeats count M times (where M is an integer of 2 or more), the area of the latch circuit can be reduced to 2/M and the area of the adder can be reduced to 1/(M−1). The area of the circuit can be more significantly reduced as the number of repetitions is increased.

In particular, in the case where the digital CDS operation is performed, M is 2 for one-time A/D conversion of the pixel signal. M is 4 in the case where digital pixel addition of two rows is implemented with the A/D conversion circuit. In this case, compared to the ordinary solid-state imaging device, in the present embodiment, the bit precision during A/D conversion can be increased while the area of the latch circuit is reduced to ½ and the area of the adder is reduced ⅓. M is 2N in the case where N rows of digital pixel addition is implemented with the column A/D conversion circuit. In this case, compared to the ordinary solid-state imaging device, in the present embodiment, the bit precision can be increased while the area of the latch circuit is reduced to 1/N and the area of the adder is reduced to 1/(2N−1).

As described above, the solid-state imaging device according to the present embodiment includes switch selector 610 which converts the binary value from conversion circuit 320 to the complement of 2, and selectively outputs one of the complement of 2 and the binary value to the adder. Such a configuration also enables subtraction in the accumulation to repeatedly perform addition.

Embodiment 3

The differences of the configuration and operation of the solid-state imaging device according to Embodiment 3 from those of Embodiments 1 and 2 will now be mainly described with reference to the drawings.

Figure 14:
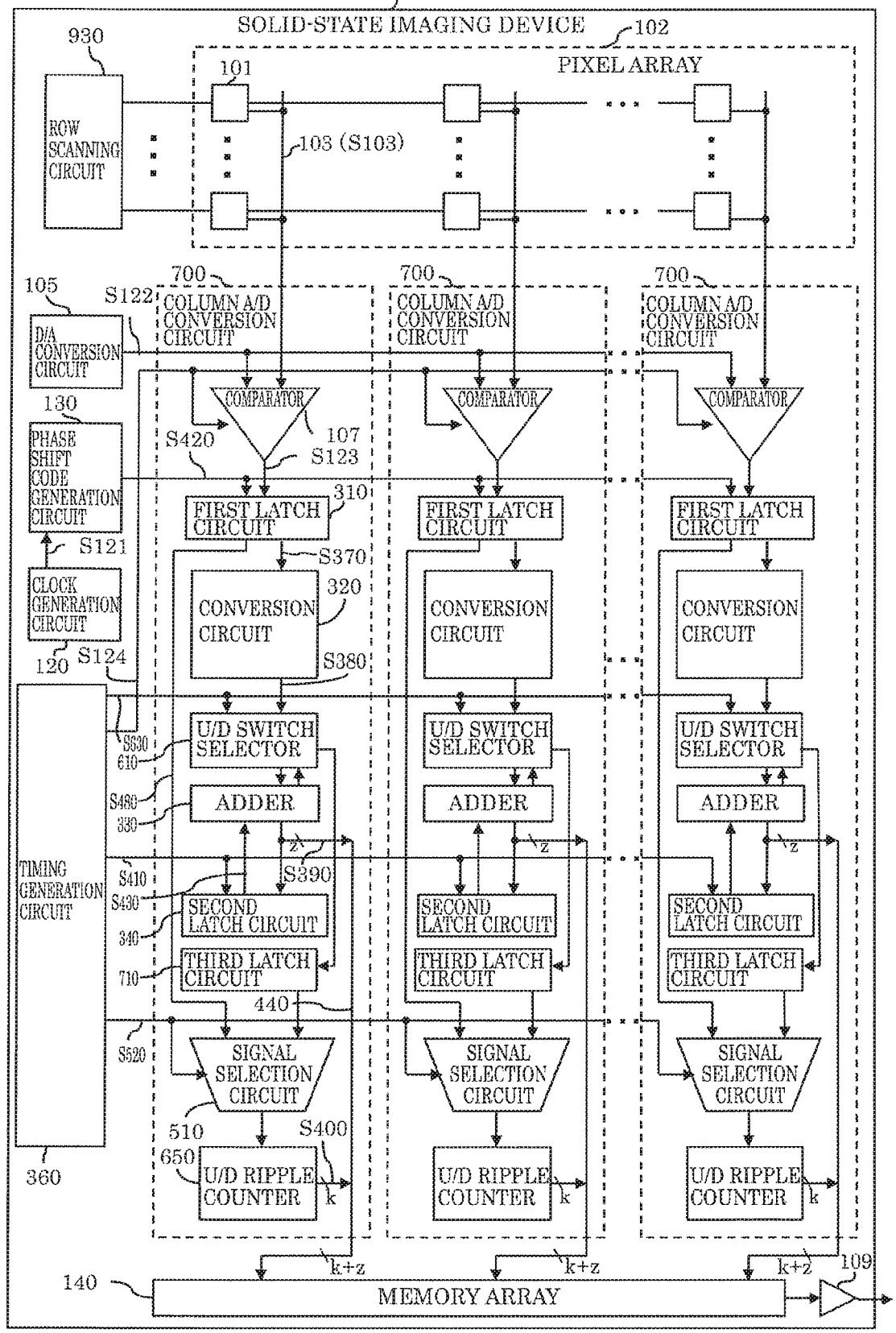
FIG. 14 is a block diagram illustrating a configurational example of the solid-state imaging device according to Embodiment 3.

FIG. 14 is a block diagram illustrating a configurational example of solid-state imaging device 3000 according to Embodiment 3. As illustrated in FIG. 14, in solid-state imaging device 3000 according to Embodiment 3, column A/D conversion circuit 600 in solid-state imaging device 2000 illustrated in FIG. 10 is replaced by column A/D conversion circuit 700. Accompanied by this modification, timing generation circuit 360 also has a modified configuration. As illustrated in FIG. 14, column A/D conversion circuit 700 is also provided for each column in the present embodiment.

Figure 15:
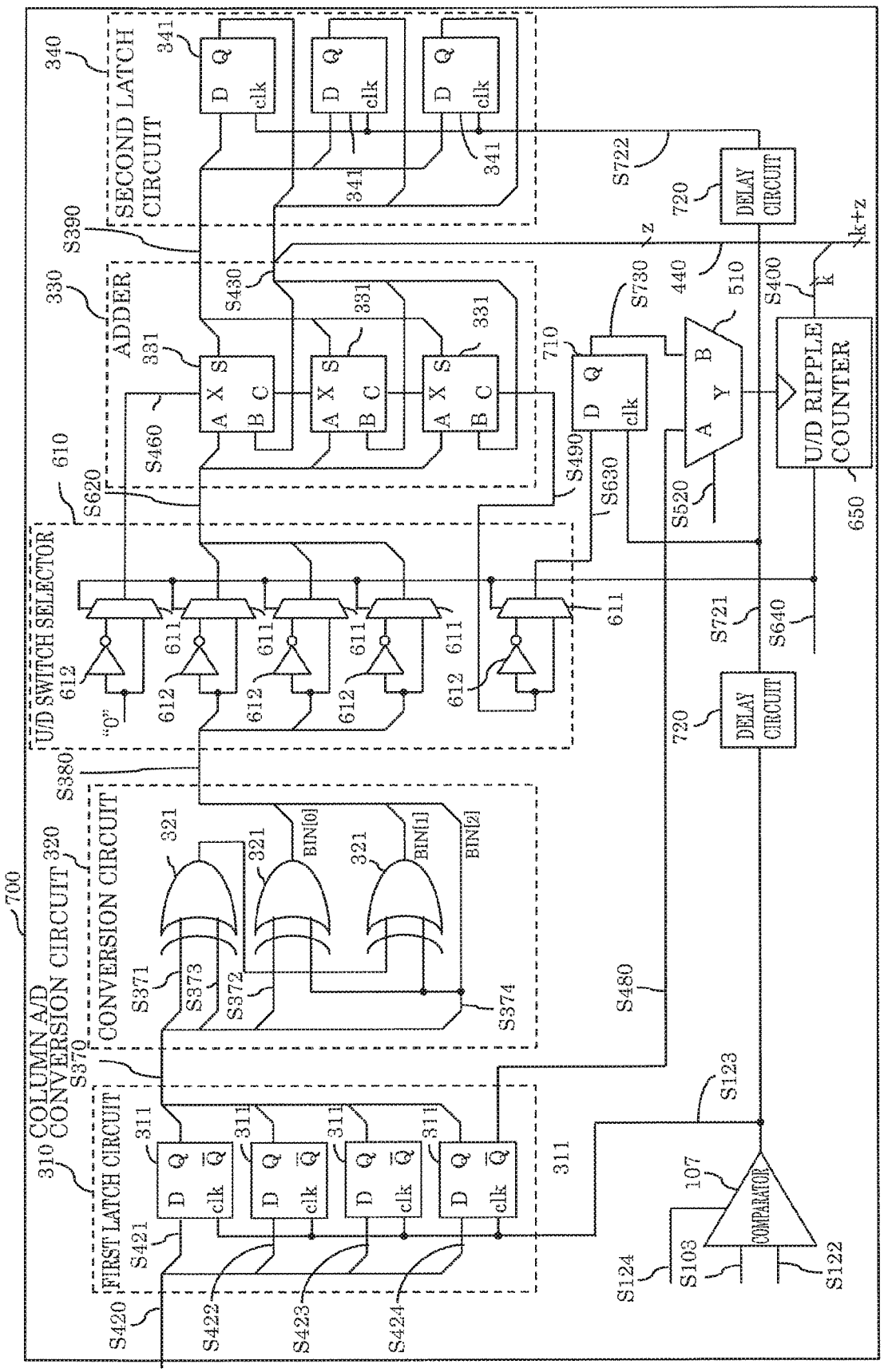
FIG. 15 is a block diagram illustrating the details of a configuration of the column A/D conversion circuit according to Embodiment 3.

FIG. 15 is a block diagram illustrating the details of a configurational example of column A/D conversion circuit 700 according to Embodiment 3. Column A/D conversion circuit 700 corresponds to column A/D conversion circuit 600 including third latch circuit 710 and two delay circuits 720. Column A/D conversion circuit 700 includes comparator 107, first latch circuit 310, conversion circuit 320, U/D switch selector 610, adder 330, second latch circuit 340, signal selection circuit 510, U/D ripple counter 650, third latch circuit 710, and delay circuit 720.

Column A/D conversion circuit 700 corresponds to column A/D conversion circuit 600 including third latch circuit 710, as an additional component, which latches carry output signal S630. Rather than latch control clock signal S410 generated in timing generation circuit 360, comparison result signal S722 obtained by delaying comparison result signal S123 is input to second latch circuit 340. Rather than addition result signal S390, second latch output signal S430 is connected to common write bus 440.

Delay circuit 720 is a circuit which delays comparison result signal S123.

Third latch circuit 710 includes two input terminals (D and clk) and one output terminal (Q). Carry output signal S630 is connected to input D, and comparison result signal S721 obtained by delaying comparison result signal S123 is connected to the clock input via delay circuit 720. After comparison result signal S123 is inverted and binary conversion signal S620 is fixed, binary conversion signal S620 is input to input A of adder 330. After addition is completed and carry output signal S490 is fixed, the delayed comparison result signal S721 is inverted from the H level (1'b1) to the L level (1'b0). Accordingly, third latch circuit latches carry output signal S630 after addition is fixed. Output Q is connected to signal selection circuit 510.

Figure 16:
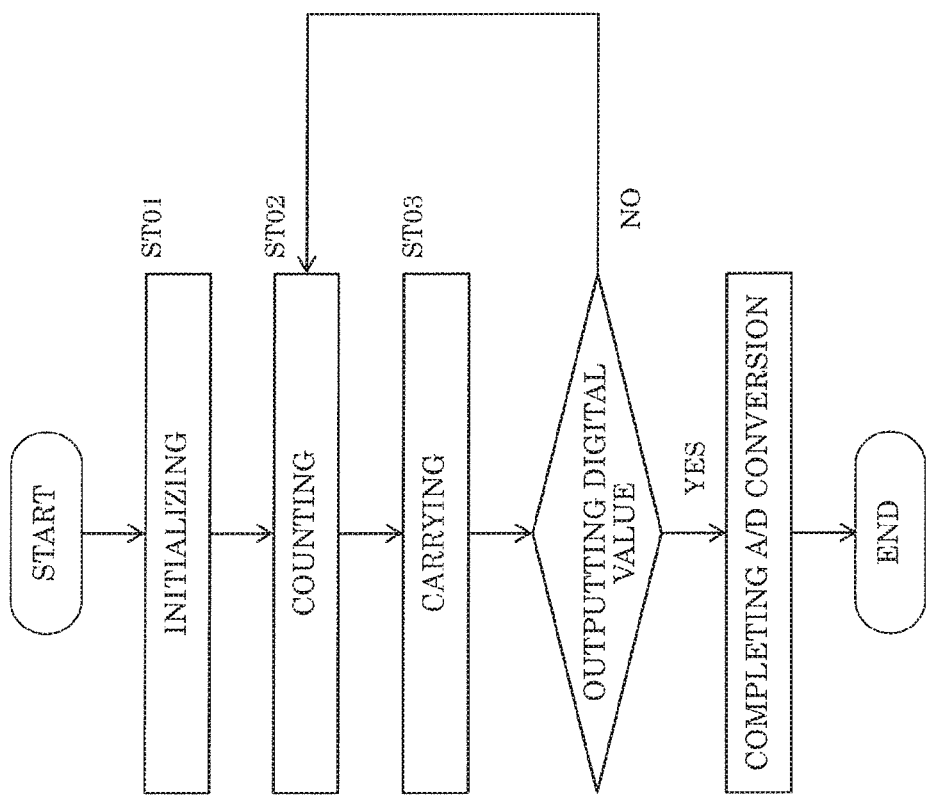
FIG. 16 is a flowchart illustrating an example of an operation of A/D conversion according to Embodiment 3.

The details of the operation (driving method) of A/D conversion in solid-state imaging device 3000 according to Embodiment 3 will now be described. In solid-state imaging device 3000, the operation of A/D conversion is performed according to the flowchart illustrated in FIG. 16. FIG. 16 is the flowchart illustrating an example of the operation of A/D conversion according to Embodiment 3. The flowchart in FIG. 16 corresponds to the flowchart in FIG. 7 without hold step ST04.

First, initializing step ST01 is as described in Embodiment 2.

Next, after initializing step ST01 is completed, the processing goes to counting step ST02. When comparison result signal S123 is inverted, the phase information of group S420 of different-phase clock signals is held in first latch circuit 310. Binary conversion signal S620 converted to a binary value is input to input A of adder 330 based on the phase information held in first latch circuit 310, and carry output signal S630 input to input D of third latch circuit 710 is fixed. After addition is completed, comparison result signal S721 obtained by delaying comparison result signal S123 is input to the clock input of third latch circuit 710. When comparison result signal S721 is inverted to the L level (1'b0), third latch circuit 710 latches carry output signal S630. After carry output signal S630 is held in third latch circuit 710, signal S722 obtained by further delaying comparison result signal S123 is input to the clock input of second latch circuit 340, and addition result signal S390 of adder 330 is held. At this time, the holding of the addition result is completed. Other operations are as described in counting step ST02 according to Embodiment 2.

After counting step ST02 is completed, the processing goes to carrying step ST03. In carrying step ST03, as in Embodiment 2, selection signal S520 is inverted to perform the carry up or down operation.

Figure 17:
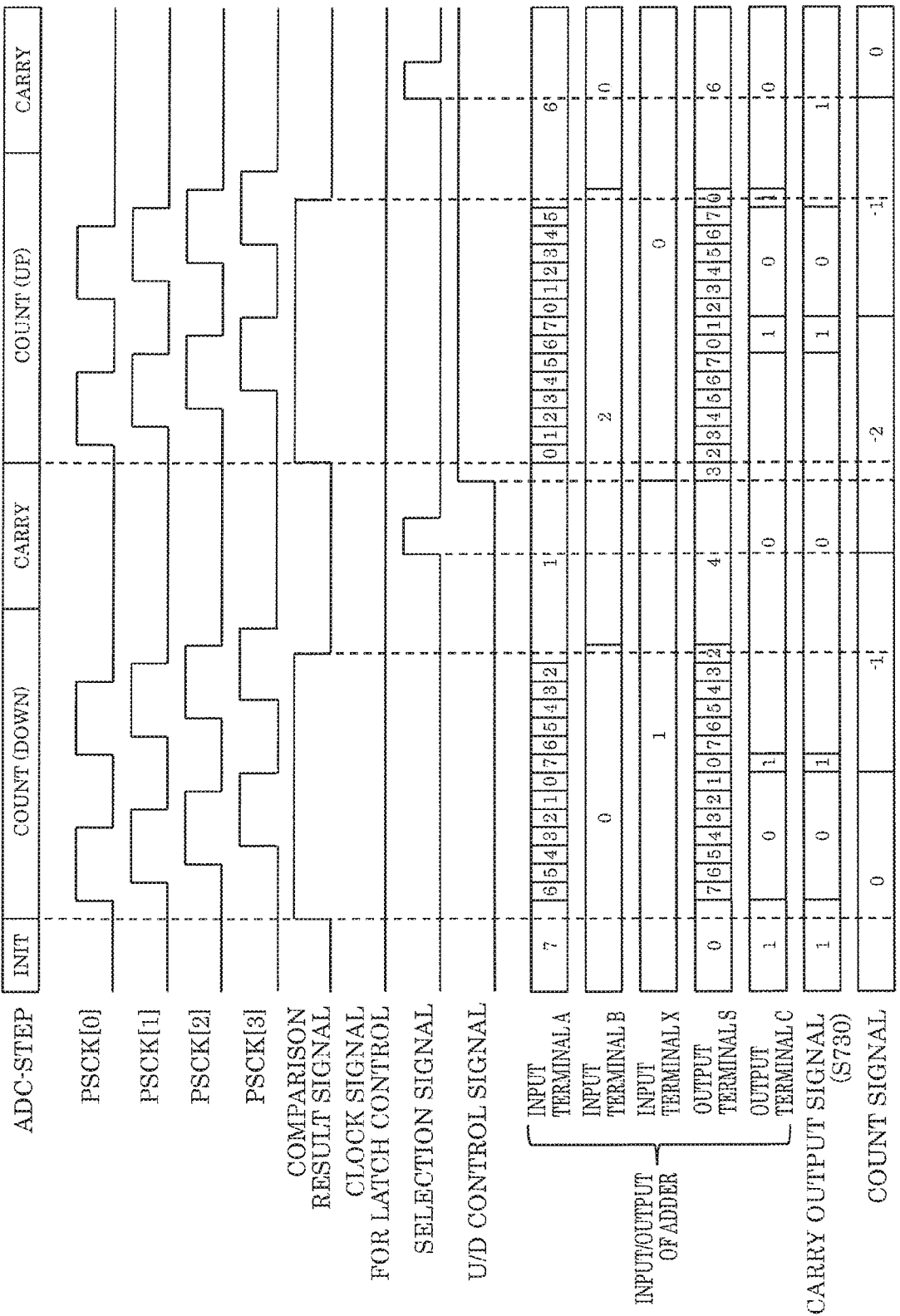
FIG. 17 is a timing chart of the signals in the column A/D conversion circuit according to Embodiment 3.

In the case where switching between count down and count up is performed, selection signal S520 is inverted, and then U/D control signal S640 is inverted. FIG. 17 is a timing chart of the signals in column A/D conversion circuit 700 according to Embodiment 3. In FIG. 17, U/D control signal S640 is inverted from the L level (1'b0) to the H level (1'b0) to perform switch from count down to count up. By inverting U/D control signal S640, binary conversion signal S380 is switched from the inverted state to the non-inverted state and carry input signal S460 is switched from the H level (1'b1) to the L level (0'b0). Other operations are as described in carrying step ST02 according to Embodiment 2.

Figure 18:
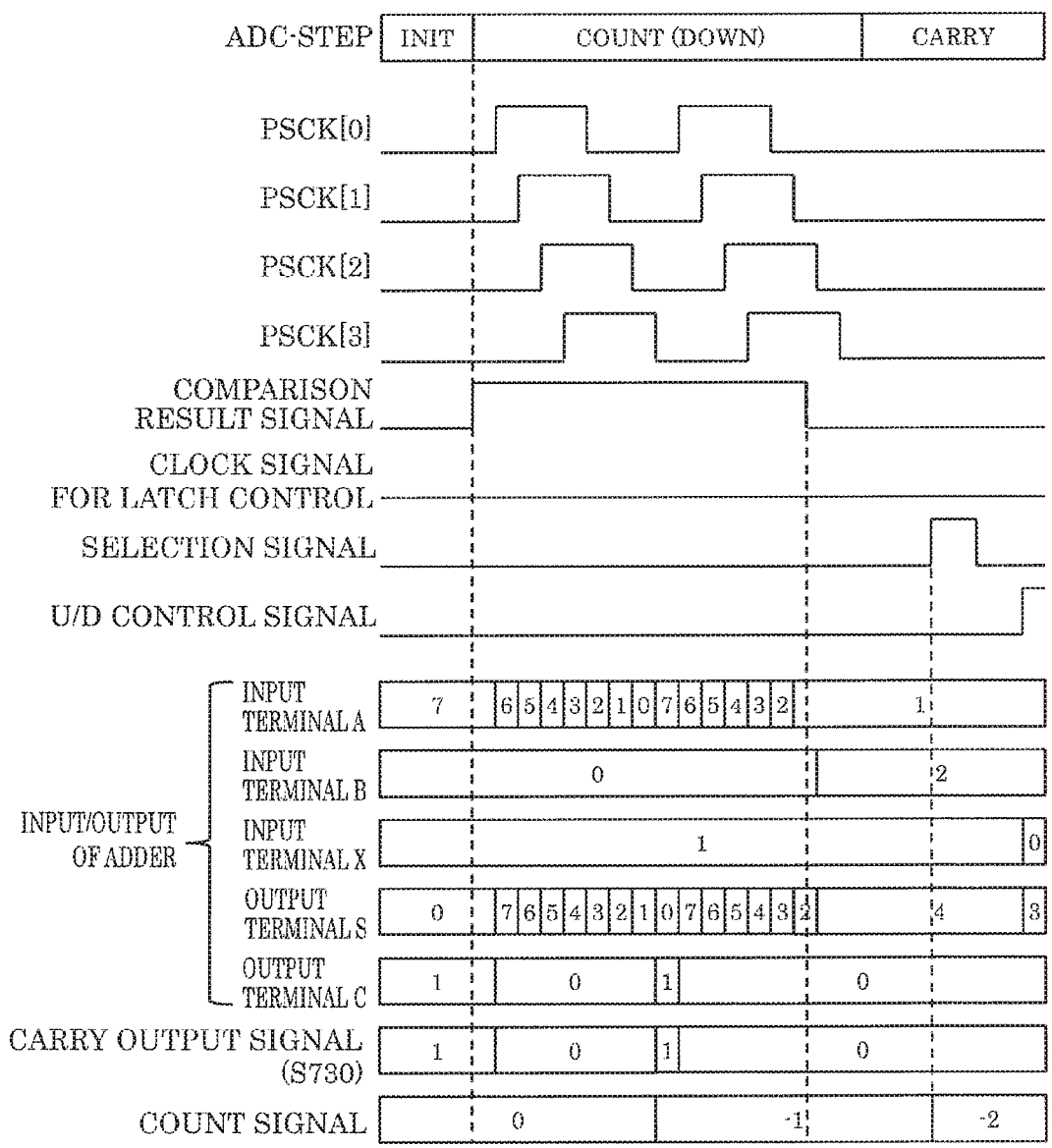
FIG. 18 is a timing chart when A/D conversion is completed in Embodiment 3.

Through the above operations, count value S400 (digital value) held in U/D ripple counter 650 and second latch output signal S430 (digital value) held in second latch circuit 340 are subjected to A/D conversion. In the present embodiment, the digital values of the lower 3 bits are held in second latch circuit 340. Here, A/D conversion is completed when the A/D converted value is output from output buffer 109. FIG. 18 is a timing chart when the A/D conversion is completed. In the example in FIG. 18, a value of −14 is output from column A/D conversion circuit 700, where the lower 3 bits correspond to the value of second latch output signal S430 (input terminal B), which is 2, and the upper bits correspond to the value of count signal S400 (count value), which is −2, and the count down operation is implemented. Thereby, the bit precision which U/D ripple counter 650 has is increased by 3 bits from second latch circuit 340.

Thereafter, according to the flowchart illustrated in FIG. 16, counting step ST02 and carrying step ST03 are repeated by a desired number of times (the number of times to perform digital CDS and digital vertical pixel addition). The A/D conversion is completed by reading out the digital value when carrying step ST03 is completed.

Except for the difference in the timing to invert comparison result signal S123 among the columns, the above operation of A/D conversion is concurrently performed on pixel signals S103 of all of the columns. After the count with a predetermined bit width is finished in U/D ripple counter 650, second latch output signal S430 and count signal S400 in U/D ripple counter 650 are transferred to memory array 140 by a transfer clock (not illustrated). Subsequently, second latch output signal S430 and count signal S400 for each column are simultaneously read out by a column scanner (not illustrated), and are output as the A/D converted values from output buffer 109.

As described above, the solid-state imaging device according to Embodiment 3 including third latch circuit 710 and delay circuit 720 in column A/D conversion circuit 700 can dispense with a clock for a latch circuit for hold step ST03 and enables a reduction in time needed for the A/D conversion. In particular, because hold step ST03 can be eliminated, the time needed for the A/D conversion can be more significantly reduced as the number of repetitions is increased.

As described above, the solid-state imaging device according to the present embodiment includes third latch circuit 710 which latches carry signal of the uppermost bit of adder 330. Third latch circuit 710 uses the comparison result signal as the clock signal for third latch circuit 710, and latches the carry signal of the uppermost bit of adder 330 when the comparison result signal is inverted.

Such a configuration enables repeated addition and subtraction at higher speed.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The solid-state imaging device according to the present disclosure has effects of enabling high speed processing with high image quality while an increase in size of the circuit is prevented, even if the number of pixels, the frame rate, and the bit width to be converted are increased, and is useful as solid-state imaging devices and as those used in imaging systems.

What is claimed is:

1. A solid-state imaging device, comprising:
a first converter which converts an analog signal representing a pixel value to an upper bit of a digital signal including the upper bit and a lower bit; and
a second converter which converts the analog signal to the lower bit of the digital signal,
wherein the second converter includes:
a first latch circuit which latches, as phase information, a plurality of clock signals upon conversion to the upper bit in the first converter, the plurality of clock signals having different phases;
a conversion circuit which generates the lower bit of the digital signal by converting the phase information to a binary value;
an adder; and
a second latch circuit which latches an addition result of the adder, and
the adder adds the binary value converted by the conversion circuit and a value latched by the second latch circuit.

2. The solid-state imaging device according to claim 1, wherein the first converter includes:
a comparison circuit which compares a level of an analog ramp signal to a level of the analog signal; and
a counter which generates the upper bit of the digital signal from the analog signal by counting time until the level of the analog ramp signal matches the level of the analog signal in a comparison result.

3. The solid-state imaging device according to claim 2, wherein the plurality of clock signals is m clock signals, where m is an integer of 2 or more, and
the first latch circuit latches m-bit phase information.

4. The solid-state imaging device according to claim 3, wherein the adder includes (m−1) full adders, and
the second latch circuit latches an (m−1)·bit addition result, which is the addition result of the adder.

5. The solid-state imaging device according to claim 3, wherein the conversion circuit converts the phase information having $2^{(m-1)}$ different phases to an (m−1)·bit binary value.

6. The solid-state imaging device according to claim 2, wherein the counter generates the upper bit of the digital signal by counting time from start of change in the analog ramp signal to inversion of the comparison result signal using a reference clock signal among the plurality of clock signals.

7. The solid-state imaging device according to claim 2, further comprising:
a signal selection circuit which switches a signal to be input to a clock inputter of the counter between a clock signal for a counter and a carry signal of an uppermost bit of the adder according to a control signal.

8. The solid-state imaging device according to claim 2, further comprising:
a switch selector which converts the binary value from the conversion circuit to a complement of 2, and selectively outputs one of the complement of 2 and the binary value to the adder.

9. The solid-state imaging device according to claim 2, further comprising:
a third latch circuit which latches a carry signal of an uppermost bit of the adder,
wherein using the comparison result signal as a clock signal for the third latch circuit, the third latch circuit latches the carry signal of the uppermost bit of the adder when the comparison result signal is inverted.

10. The solid-state imaging device according to claim 2, wherein the counter counts in any of an up-count mode and a down-count mode according to a control signal.

11. An imaging system, comprising:
the solid-state imaging device according to claim 1; and
an image signal processor which performs image processing on an output signal of the solid-state imaging device.

* * * * *